United States Patent
Hahn et al.

(10) Patent No.: US 9,634,823 B1
(45) Date of Patent: Apr. 25, 2017

(54) SYSTEMS FOR INTEGRATED SELF-INTERFERENCE CANCELLATION

(71) Applicant: Kumu Networks, Inc., Sunnyvale, CA (US)

(72) Inventors: Wilhelm Steffen Hahn, Los Altos, CA (US); Alfred Riddle, San Jose, CA (US); Ernie Landi, Milpitas, CA (US)

(73) Assignee: Kumu Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/269,672

(22) Filed: Sep. 19, 2016

Related U.S. Application Data

(60) Provisional application No. 62/240,835, filed on Oct. 13, 2015.

(51) Int. Cl.
| | |
|---|---|
| *H04L 5/14* | (2006.01) |
| *H04B 15/00* | (2006.01) |
| *H04B 1/44* | (2006.01) |

(52) U.S. Cl.
CPC ............... *H04L 5/14* (2013.01); *H04B 1/44* (2013.01); *H04B 15/00* (2013.01)

(58) Field of Classification Search
CPC .. H03M 1/0648; H03M 1/682; H03M 1/0651; H03M 1/687; H03M 1/747;
(Continued)

(56) References Cited

U.S. PATENT DOCUMENTS

| | | | |
|---|---|---|---|
| 3,922,617 | A | 11/1975 | Denniston et al. |
| 4,321,624 | A | 3/1982 | Gibson et al. |

(Continued)

FOREIGN PATENT DOCUMENTS

| | | |
|---|---|---|
| EP | 0755141 A2 | 1/1997 |
| EP | 1959625 B1 | 2/2009 |

(Continued)

OTHER PUBLICATIONS

Bharadia et al., "Full Duplex Radios" SIGOMM, Aug. 12-16, 2013, Hong Kong, China, Copyright 2013 ACM 978-1-4503-2056-6/6/13/08, 12 pages.

(Continued)

*Primary Examiner* — Jung-Jen Liu
(74) *Attorney, Agent, or Firm* — Jeffrey Schox; Thomas Gwinn

(57) ABSTRACT

A system for integrated self-interference cancellation, comprising a transmit coupler, coupled to a transmit signal, that samples the transmit signal to create a sampled transmit signal; an analog self-interference canceller, coupled to the transmit coupler, comprising a controller; a signal divider, that splits the sampled transmit signal into a set of signal components; a set of phase shifters, wherein a phase shifter of the set shifts a signal component of the set of signal components by a total phase shift value; a set of scalers, wherein a scaler of the set scales the signal component by a total scale factor; a signal combiner, that combines the set of signal components into a self-interference cancellation signal; and a receive coupler, coupled to a receive signal, that combines the self-interference cancellation signal with the receive signal to remove a portion of self-interference present in the receive signal.

20 Claims, 16 Drawing Sheets

(58) Field of Classification Search
CPC ...... H03M 3/386; H03M 3/458; H03J 1/0091; H03J 2200/10; H03D 2200/0047; H03D 2200/009; H03D 2200/0043; H03D 7/1483; H03D 7/1433; H03D 7/1458; H03D 7/166; H03D 7/144
See application file for complete search history.

(56) References Cited

U.S. PATENT DOCUMENTS

| | | | |
|---|---|---|---|
| 4,952,193 | A | 8/1990 | Talwar |
| 5,212,827 | A | 5/1993 | Meszko et al. |
| 5,691,978 | A | 11/1997 | Kenworthy |
| 5,734,967 | A | 3/1998 | Kotzin et al. |
| 5,790,658 | A | 8/1998 | Yip et al. |
| 5,818,385 | A | 10/1998 | Bartholomew |
| 5,930,301 | A | 7/1999 | Chester et al. |
| 6,215,812 | B1 | 4/2001 | Young et al. |
| 6,240,150 | B1 | 5/2001 | Darveau et al. |
| 6,411,250 | B1 | 6/2002 | Oswald et al. |
| 6,539,204 | B1 | 3/2003 | Marsh et al. |
| 6,567,649 | B2 | 5/2003 | Souissi |
| 6,639,551 | B2 | 10/2003 | Li et al. |
| 6,657,950 | B1 | 12/2003 | Jones et al. |
| 6,725,017 | B2 | 4/2004 | Blount et al. |
| 6,965,657 | B1 | 11/2005 | Rezvani et al. |
| 7,336,940 | B2 | 2/2008 | Smithson |
| 7,349,505 | B2 | 3/2008 | Blount et al. |
| 7,362,257 | B2 | 4/2008 | Bruzzone et al. |
| 7,426,242 | B2 | 9/2008 | Thesling |
| 7,509,100 | B2 | 3/2009 | Toncich |
| 7,778,611 | B2 | 8/2010 | Asai et al. |
| 7,869,527 | B2 | 1/2011 | Vetter et al. |
| 8,005,235 | B2 | 8/2011 | Rebandt et al. |
| 8,027,642 | B2 | 9/2011 | Proctor et al. |
| 8,055,235 | B1 | 11/2011 | Gupta et al. |
| 8,060,803 | B2 | 11/2011 | Kim |
| 8,086,191 | B2 | 12/2011 | Fukuda et al. |
| 8,155,595 | B2 | 4/2012 | Sahin et al. |
| 8,175,535 | B2 | 5/2012 | Mu |
| 8,179,990 | B2 | 5/2012 | Orlik et al. |
| 8,218,697 | B2 | 7/2012 | Guess et al. |
| 8,331,477 | B2 | 12/2012 | Huang et al. |
| 8,351,533 | B2 | 1/2013 | Shrivastava et al. |
| 8,385,871 | B2 | 2/2013 | Wyville |
| 8,422,540 | B1 | 4/2013 | Negus et al. |
| 8,755,756 | B1 | 6/2014 | Zhang et al. |
| 8,842,584 | B2 | 9/2014 | Jana et al. |
| 8,995,410 | B2 | 3/2015 | Balan et al. |
| 9,019,849 | B2 | 4/2015 | Hui et al. |
| 9,042,838 | B2 | 5/2015 | Braithwaite |
| 9,054,795 | B2 | 6/2015 | Choi et al. |
| 9,077,421 | B1 | 7/2015 | Mehlman et al. |
| 9,124,475 | B2 | 9/2015 | Li et al. |
| 9,136,883 | B1 | 9/2015 | Moher et al. |
| 9,184,902 | B2 | 11/2015 | Khojastepour et al. |
| 9,231,647 | B2 | 1/2016 | Polydoros et al. |
| 9,312,895 | B1 | 4/2016 | Gupta et al. |
| 2002/0034191 | A1 | 3/2002 | Shattil |
| 2002/0064245 | A1 | 5/2002 | McCorkle |
| 2002/0154717 | A1 | 10/2002 | Shima et al. |
| 2002/0172265 | A1 | 11/2002 | Kenney |
| 2003/0031279 | A1 | 2/2003 | Blount et al. |
| 2003/0099287 | A1 | 5/2003 | Arambepola |
| 2003/0104787 | A1 | 6/2003 | Blount et al. |
| 2003/0148748 | A1 | 8/2003 | Shah |
| 2004/0106381 | A1 | 6/2004 | Tiller |
| 2004/0266378 | A1 | 12/2004 | Fukamachi et al. |
| 2005/0078743 | A1 | 4/2005 | Shohara |
| 2005/0129152 | A1 | 6/2005 | Hillstrom |
| 2005/0159128 | A1 | 7/2005 | Collins et al. |
| 2005/0190870 | A1 | 9/2005 | Blount et al. |
| 2005/0242830 | A1* | 11/2005 | Humphrey ......... H03K 19/0005 326/30 |
| 2005/0250466 | A1 | 11/2005 | Varma et al. |
| 2005/0254555 | A1 | 11/2005 | Teague |
| 2005/0282500 | A1 | 12/2005 | Wang et al. |
| 2006/0029124 | A1 | 2/2006 | Grant et al. |
| 2006/0030277 | A1 | 2/2006 | Cyr et al. |
| 2006/0058022 | A1 | 3/2006 | Webster et al. |
| 2006/0083297 | A1 | 4/2006 | Yan et al. |
| 2006/0209754 | A1 | 9/2006 | Ji et al. |
| 2006/0273853 | A1 | 12/2006 | Suzuki et al. |
| 2007/0018722 | A1 | 1/2007 | Jaenecke |
| 2007/0105509 | A1 | 5/2007 | Muhammad et al. |
| 2007/0207747 | A1 | 9/2007 | Johnson et al. |
| 2007/0249314 | A1 | 10/2007 | Sanders et al. |
| 2007/0274372 | A1 | 11/2007 | Asai et al. |
| 2008/0037801 | A1 | 2/2008 | Alves et al. |
| 2008/0089397 | A1 | 4/2008 | Vetter et al. |
| 2008/0107046 | A1 | 5/2008 | Kangasmaa et al. |
| 2008/0111754 | A1 | 5/2008 | Osterhues et al. |
| 2008/0131133 | A1 | 6/2008 | Blunt et al. |
| 2008/0192636 | A1 | 8/2008 | Briscoe et al. |
| 2008/0219339 | A1 | 9/2008 | Chrabieh et al. |
| 2008/0219377 | A1 | 9/2008 | Nisbet |
| 2009/0022089 | A1 | 1/2009 | Rudrapatna |
| 2009/0034437 | A1 | 2/2009 | Shin et al. |
| 2009/0047914 | A1 | 2/2009 | Axness et al. |
| 2009/0115912 | A1 | 5/2009 | Liou et al. |
| 2009/0180404 | A1 | 7/2009 | Jung et al. |
| 2009/0186582 | A1* | 7/2009 | Muhammad ........... H04B 1/525 455/63.1 |
| 2009/0221231 | A1 | 9/2009 | Weng et al. |
| 2009/0303908 | A1 | 12/2009 | Deb et al. |
| 2010/0014600 | A1 | 1/2010 | Li et al. |
| 2010/0014614 | A1 | 1/2010 | Leach et al. |
| 2010/0022201 | A1 | 1/2010 | Vandenameele |
| 2010/0031036 | A1 | 2/2010 | Chauncey et al. |
| 2010/0056166 | A1 | 3/2010 | Tenny |
| 2010/0103900 | A1 | 4/2010 | Yeh et al. |
| 2010/0117693 | A1 | 5/2010 | Lorg et al. |
| 2010/0136900 | A1 | 6/2010 | Seki |
| 2010/0150033 | A1 | 6/2010 | Zinser et al. |
| 2010/0150070 | A1 | 6/2010 | Park et al. |
| 2010/0159858 | A1* | 6/2010 | Dent ................. H04B 1/123 455/131 |
| 2010/0215124 | A1 | 8/2010 | Zeong et al. |
| 2010/0226416 | A1 | 9/2010 | Dent et al. |
| 2010/0226448 | A1 | 9/2010 | Dent |
| 2010/0232324 | A1 | 9/2010 | Radunovic et al. |
| 2010/0279602 | A1 | 11/2010 | Larsson et al. |
| 2010/0295716 | A1 | 11/2010 | Yamaki et al. |
| 2011/0013684 | A1 | 1/2011 | Semenov et al. |
| 2011/0026509 | A1 | 2/2011 | Tanaka |
| 2011/0081880 | A1 | 4/2011 | Ahn |
| 2011/0149714 | A1 | 6/2011 | Rimini et al. |
| 2011/0171922 | A1 | 7/2011 | Kim et al. |
| 2011/0216813 | A1 | 9/2011 | Baldemair et al. |
| 2011/0222631 | A1 | 9/2011 | Jong |
| 2011/0243202 | A1 | 10/2011 | Lakkis |
| 2011/0250858 | A1 | 10/2011 | Jain et al. |
| 2011/0254639 | A1 | 10/2011 | Tsutsumi et al. |
| 2011/0256857 | A1 | 10/2011 | Chen et al. |
| 2011/0268232 | A1 | 11/2011 | Park et al. |
| 2011/0311067 | A1 | 12/2011 | Harris et al. |
| 2011/0319044 | A1 | 12/2011 | Bornazyan |
| 2012/0021153 | A1 | 1/2012 | Bhandari et al. |
| 2012/0063369 | A1 | 3/2012 | Lin et al. |
| 2012/0063373 | A1 | 3/2012 | Chincholi et al. |
| 2012/0140685 | A1 | 6/2012 | Lederer et al. |
| 2012/0147790 | A1 | 6/2012 | Khojastepour et al. |
| 2012/0154249 | A1 | 6/2012 | Khojastepour et al. |
| 2012/0155335 | A1 | 6/2012 | Khojastepour et al. |
| 2012/0155336 | A1 | 6/2012 | Khojastepour et al. |
| 2012/0201153 | A1* | 8/2012 | Bharadia ............. H04B 1/525 370/252 |
| 2012/0201173 | A1 | 8/2012 | Jain et al. |
| 2012/0224497 | A1 | 9/2012 | Lindoff et al. |
| 2013/0005284 | A1 | 1/2013 | Dalipi |
| 2013/0044791 | A1* | 2/2013 | Rimini ................ H04B 1/109 375/219 |
| 2013/0089009 | A1 | 4/2013 | Li et al. |
| 2013/0102254 | A1 | 4/2013 | Cyzs et al. |

(56) References Cited

U.S. PATENT DOCUMENTS

| | | | |
|---|---|---|---|
| 2013/0114468 A1* | 5/2013 | Hui | H01Q 3/2611 370/277 |
| 2013/0155913 A1 | 6/2013 | Sarca | |
| 2013/0166259 A1 | 6/2013 | Weber et al. | |
| 2013/0194984 A1 | 8/2013 | Cheng et al. | |
| 2013/0215805 A1 | 8/2013 | Hong et al. | |
| 2013/0225101 A1 | 8/2013 | Basaran et al. | |
| 2013/0253917 A1 | 9/2013 | Schildbach | |
| 2013/0259343 A1 | 10/2013 | Liu et al. | |
| 2013/0301487 A1* | 11/2013 | Khandani | H04W 16/14 370/278 |
| 2013/0301488 A1 | 11/2013 | Hong et al. | |
| 2013/0308717 A1 | 11/2013 | Maltsev et al. | |
| 2014/0011461 A1* | 1/2014 | Bakalski | H04B 1/3805 455/78 |
| 2014/0126437 A1 | 5/2014 | Patil et al. | |
| 2014/0169236 A1 | 6/2014 | Choi et al. | |
| 2014/0185533 A1 | 7/2014 | Haub | |
| 2014/0206300 A1* | 7/2014 | Hahn | H04B 1/525 455/78 |
| 2014/0219139 A1 | 8/2014 | Choi et al. | |
| 2014/0219449 A1 | 8/2014 | Shattil et al. | |
| 2014/0313946 A1 | 10/2014 | Azadet | |
| 2014/0348018 A1* | 11/2014 | Bharadia | H04L 5/1461 370/252 |
| 2014/0348032 A1* | 11/2014 | Hua | H04B 1/44 370/277 |
| 2014/0376416 A1 | 12/2014 | Choi | |
| 2015/0156003 A1 | 6/2015 | Khandani | |
| 2015/0156004 A1* | 6/2015 | Khandani | H04L 5/1423 370/278 |
| 2015/0215937 A1 | 7/2015 | Khandani | |
| 2015/0249444 A1 | 9/2015 | Shin et al. | |
| 2015/0303984 A1 | 10/2015 | Braithwaite | |
| 2016/0218769 A1 | 7/2016 | Chang et al. | |

FOREIGN PATENT DOCUMENTS

| | | |
|---|---|---|
| EP | 2237434 A1 | 10/2010 |
| EP | 2267946 A2 | 12/2010 |
| RU | 2256985 C2 | 7/2005 |
| WO | 2013173250 A1 | 11/2013 |
| WO | 2013185106 A1 | 12/2013 |
| WO | 2014093916 A1 | 6/2014 |

OTHER PUBLICATIONS

McMichael et al., "Optimal Tuning of Analog Self-Interference Cancellers for Full-Duple Wireless Communication", Oct. 1-5, 2012, Fiftieth Annual Allerton Conference, Illinois, USA, pp. 246-251.

* cited by examiner

SYSTEMS FOR INTEGRATED SELF-INTERFERENCE CANCELLATION

CROSS-REFERENCE TO RELATED APPLICATIONS

This application claims the benefit of U.S. Provisional Application Ser. No. 62/240,835, filed on 13 Oct. 2015, which is incorporated in its entirety by this reference.

TECHNICAL FIELD

This invention relates generally to the wireless communications field, and more specifically to new and useful systems for integrated self-interference cancellation.

BACKGROUND

Traditional wireless communication systems are half-duplex; that is, they are not capable of transmitting and receiving signals simultaneously on a single wireless communications channel. Recent work in the wireless communications field has led to advancements in developing full-duplex wireless communications systems; these systems, if implemented successfully, could provide enormous benefit to the wireless communications field. For example, the use of full-duplex communications by cellular networks could cut spectrum needs in half. One major roadblock to successful implementation of full-duplex communications is the problem of self-interference. While progress has been made in this area, many traditional solutions intended to address self-interference can require complex circuits and layouts that increase production costs, power, size and result in lower-than-ideal component utilization. Thus, there is a need in the wireless communications field to create new and useful systems for integrated self-interference cancellation. This invention provides such new and useful systems.

DESCRIPTION OF THE PREFERRED EMBODIMENTS

Figure 1:
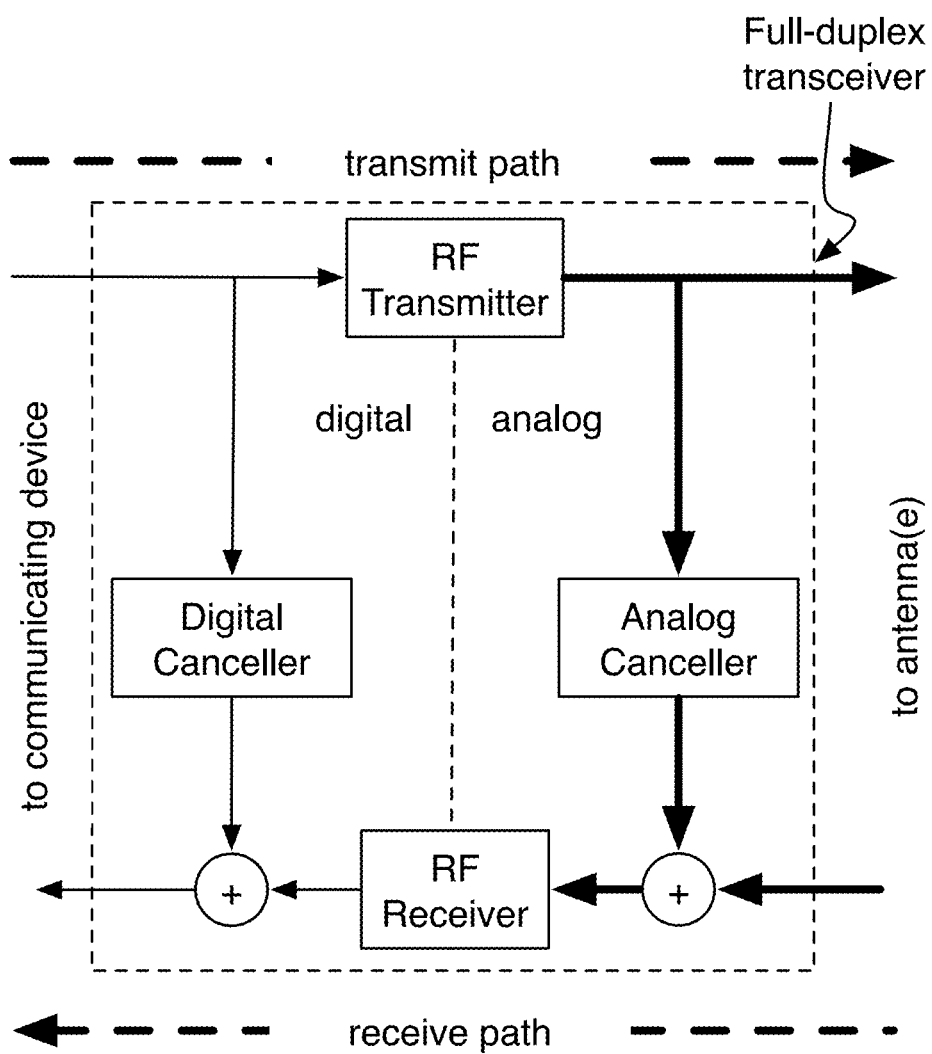
FIG. 1 is a schematic representation of a full-duplex transceiver.

The following description of the preferred embodiments of the invention is not intended to limit the invention to these preferred embodiments, but rather to enable any person skilled in the art to make and use this invention.

1. Full-Duplex Wireless Communication Systems

Wireless communications systems have revolutionized the way the world communicates, and the rapid growth of communication using such systems has provided increased economic and educational opportunity across all regions and industries. Unfortunately, the wireless spectrum required for communication is a finite resource, and the rapid growth in wireless communications has also made the availability of this resource ever scarcer. As a result, spectral efficiency has become increasingly important to wireless communications systems.

One promising solution for increasing spectral efficiency is found in full-duplex wireless communications systems; that is, wireless communications systems that are able to transmit and receive wireless signals at the same time on the same wireless channel. This technology allows for a doubling of spectral efficiency compared to standard half-duplex wireless communications systems.

While full-duplex wireless communications systems have substantial value to the wireless communications field, such systems have been known to face challenges due to self-interference; because reception and transmission occur at the same time on the same channel, the received signal at a full-duplex transceiver can include undesired signal components from the signal being transmitted from that transceiver. As a result, full-duplex wireless communications systems often include analog and/or digital self-interference cancellation circuits to reduce self-interference.

Full-duplex transceivers preferably sample transmission output as baseband digital signals, intermediate frequency (IF) analog signals, or as radio-frequency (RF) analog signals, but full-duplex transceivers can additionally or alternatively sample transmission output in any suitable manner (e.g., as IF digital signals). This sampled transmission output can be used by full-duplex transceivers to remove interference from received wireless communications data (e.g., as RF/IF analog signals or baseband digital signals). In many full-duplex transceivers, an analog self-interference cancellation system is paired with a digital self-interference cancellation system. The analog self-interference cancellation system removes a first portion of self-interference by summing delayed, phase shifted and scaled versions of the RF transmit signal to create an RF self-interference cancellation signal, which is then subtracted from the RF receive signal. Alternatively, the analog cancellation system can perform similar tasks at an intermediate frequency. After the RF (and/or IF) receive signal has the RF/IF self-interference cancellation signal subtracted, it passes through an analog-to-digital converter of the receiver (and becomes a digital receive signal). After this stage, a digital self-interference cancellation signal (created by transforming a digital transmit signal) is then subtracted from the digital receive signal.

Traditionally, analog self-interference cancellation systems in such an architecture do not effectively utilize integrated circuit techniques (e.g., grouping analog cancellation components by component type or across signal paths); resultantly, the printed circuit boards (PCBs) required for self-interference cancellation systems can be overly expensive and/or complex.

The systems described herein increase performance and reduce circuit complexity of full-duplex transceivers as shown in FIG. 1 (and other applicable systems) by utilizing circuit integration techniques (and in some cases, optimizations for individual components to effectively enable such techniques). Other applicable systems include active sensing systems (e.g., RADAR), wired communications systems, wireless communications systems, channel emulators, reflectometers, PIM analyzers and/or any other suitable measurement equipment system, including communication systems where transmit and receive bands are close in frequency, but not overlapping, or even TDD (time division duplex) systems.

2. System for Integrated Self-Interference Cancellation

Figure 2:
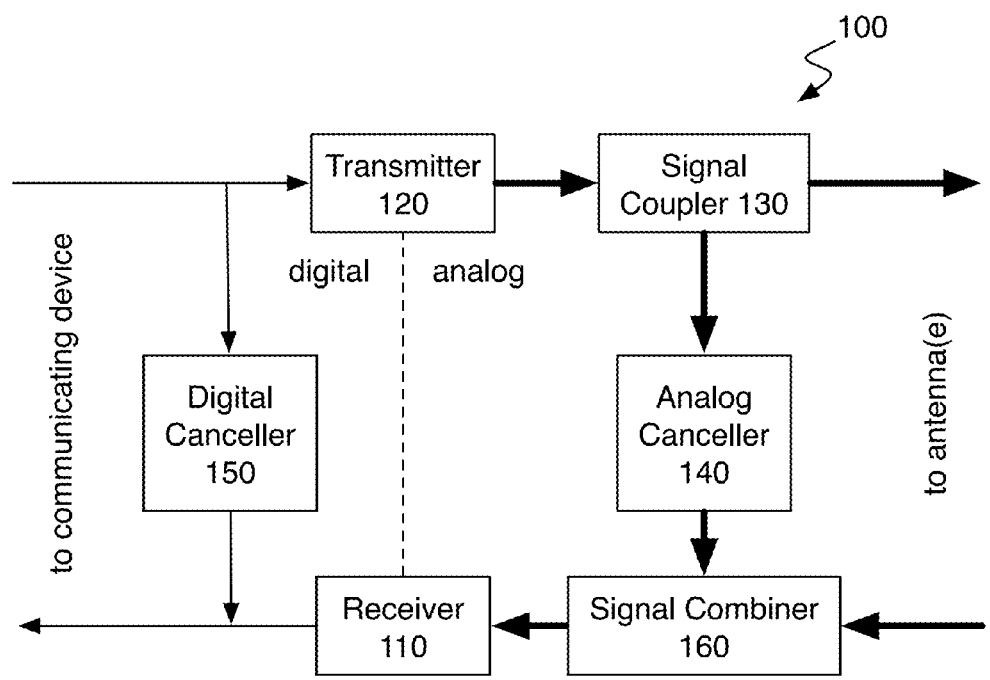
FIG. 2 is a schematic representation of a system of a preferred embodiment.
Figure 3:
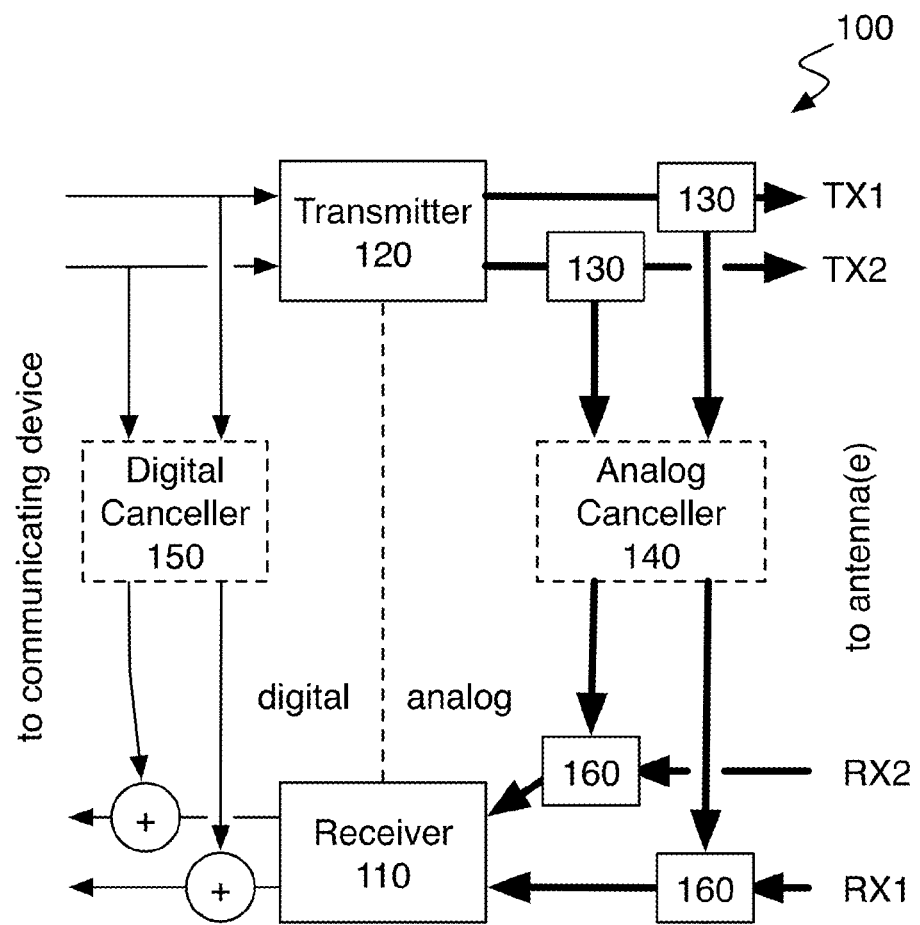
FIG. 3 is a schematic representation of a system of a preferred embodiment.

As shown in FIG. 2 and FIG. 3, a system 100 for self-interference canceller tuning includes a receiver 110, a transmitter 120, a transmit coupler 130, an analog self-interference canceller 140, and a receive coupler 160. The system 100 may additionally or alternatively include a digital self-interference canceller 150 and/or a controller 170.

The system 100 functions to increase the performance of full-duplex transceivers (or other applicable systems) by performing self-interference cancellation using an integrated architecture. The system 100 is preferably applicable to both single-in single-out (SISO) communication applications as well as multiple-in multiple-out (MIMO) applications.

The system 100 may perform self-interference cancellation by performing analog and/or digital self-interference cancellation based on any number of sampled analog and/or digital transmit signals. For example, the digital self-interference canceller 160 may sample a digital transmit signal, as shown in FIGS. 2 and 3, but the digital self-interference canceller 160 may additionally or alternatively sample an analog transmit signal (e.g., through an ADC coupled to the analog transmit signal).

The system 100 preferably performs analog and digital self-interference cancellation simultaneously and in parallel, but may additionally or alternatively perform analog and/or digital self-interference cancellation at any suitable times and in any order.

The system 100 is preferably implemented using both digital and analog circuitry. Digital circuitry is preferably implemented using a general-purpose processor, a digital signal processor, an application specific integrated circuit (ASIC), a field programmable gate array (FPGA) and/or any suitable processor(s) or circuit(s). Analog circuitry is preferably implemented using analog integrated circuits (ICs) but may additionally or alternatively be implemented using discrete components (e.g., capacitors, resistors, transistors), wires, transmission lines, transformers, couplers, hybrids, waveguides, digital components, mixed-signal components, or any other suitable components. The system 100 preferably includes memory to store configuration data, but may additionally or alternatively be configured using externally stored configuration data or in any suitable manner.

The receiver 110 functions to receive analog receive signals transmitted over a communications link (e.g., a wireless channel, a coaxial cable). The receiver 110 preferably converts analog receive signals into digital receive signals for processing by a communications system, but may additionally or alternatively not convert analog receive signals (passing them through directly without conversion).

The receiver 110 is preferably a radio-frequency (RF) receiver, but may additionally or alternatively be any suitable receiver.

The receiver 110 is preferably coupled to the communications link by a duplexer-coupled RF antenna, but may additionally or alternatively be coupled to the communications link in any suitable manner. Some examples of alternative couplings include coupling via one or more dedicated receive antennas. In another alternative coupling, the receiver 110 may be coupled to the communications link by a circulator-coupled RF antenna.

The receiver 110 preferably includes an analog-to-digital converter (ADC) and a frequency downconverter. The receiver 110 may additionally include a low-noise amplifier. The receiver 110 may additionally or alternatively include amplifiers, filters, signal processors and/or any other suitable components. In one variation of a preferred embodiment, the receiver 110 includes only analog processing circuitry (e.g., amplifiers, filters, attenuators, delays). The receiver may function to scale, shift, and/or otherwise modify the receive signal. The downconverter functions to downconvert the analog receive signal from RF (or any other suitable frequency) to a baseband or IF analog receive signal, and the analog-to-digital converter (ADC) functions to convert the baseband or IF analog receive signal to a digital receive signal.

In MIMO implementations of the system 100, the system 100 may include multiple receivers 110; alternatively, a single receiver 110 may receive on multiple channels of communication.

The transmitter 120 functions to transmit signals of the communications system over a communications link to a second communications system. The transmitter 120 preferably converts digital transmit signals into analog transmit signals.

The transmitter 120 is preferably a radio-frequency (RF) transmitter, but may additionally or alternatively be any suitable transmitter.

The transmitter 120 is preferably coupled to the communications link by a duplexer-coupled RF antenna, but may additionally or alternatively be coupled to the communications link in any suitable manner. Some examples of alternative couplings include coupling via one or more dedicated transmit antennas. In another alternative coupling, the transmitter 120 may be coupled to the communications link by a circulator-coupled RF antenna.

The transmitter 120 preferably includes a digital-to-analog converter (DAC) and a frequency upconverter. The transmitter 120 may additionally include a power amplifier. The transmitter 120 may additionally or alternatively include amplifiers, filters, signal processors and/or any other suitable components. The transmitter 120 may function to scale, phase shift, delay, and/or otherwise modify the transmit signal. The digital-to-analog converter (DAC) functions to convert the digital transmit signal to a baseband or IF analog transmit signal, and the upconverter functions to upconvert the baseband or IF analog transmit signal from baseband or IF to RF (or any other intended transmission frequency).

In MIMO implementations of the system 100, the system 100 may include multiple transmitters 120; alternatively, a single transmitter 120 may transmit on multiple channels of communication.

The transmit coupler 130 functions to provide a sample of the analog transmit signal for the analog canceller 140 and/or the digital canceller 150. Transmit couplers may additionally be used to split power between signal paths (e.g., splitting power between different analog canceller 140 blocks).

The transmit coupler 130 is preferably a short section directional transmission line coupler, but may additionally or alternatively be any power divider, power combiner, directional coupler, or other type of signal splitter. The transmit coupler 130 is preferably a passive coupler, but may additionally or alternatively be an active coupler (for instance, including power amplifiers). For example, the transmit coupler 130 may comprise a coupled transmission line coupler, a branch-line coupler, a Lange coupler, a Wilkinson power divider, a hybrid coupler, a hybrid ring coupler, a multiple output divider, a waveguide directional coupler, a waveguide power coupler, a hybrid transformer coupler, a cross-connected transformer coupler, a resistive or capacitive tee, and/or a resistive bridge hybrid coupler. The output ports of the transmit coupler 130 are preferably phase-shifted by ninety degrees, but may additionally or alternatively be in phase or phase shifted by any amount (e.g., zero degrees, 180 degrees).

Transmit couplers 130 may be arranged in series and/or in parallel. The configuration of multiple transmit couplers 130 in the system 100 is discussed in further detail in Section 3 (Integrated Self-Interference Cancellation System Configurations).

The analog self-interference canceller 140 functions to produce an analog self-interference cancellation signal from the analog transmit signal that can be combined with the analog receive signal to reduce self-interference present in the analog receive signal. The analog self-interference canceller 140 is preferably designed to operate at a single radio frequency (RF) band, but may additionally or alternatively be designed to operate at multiple RF bands, at one or multiple intermediate frequency (IF) bands, or at any suitable frequency band.

The analog self-interference canceller 140 is preferably implemented as one or more analog circuits that transform an RF transmit signal into an analog self-interference cancellation signal by combining a set of filtered, scaled, phase-shifted, and/or delayed versions of the RF transmit signal, but may additionally or alternatively be implemented as any suitable circuit. For instance, the analog self-interference canceller 140 may perform a transformation involving only a single version or copy of the RF transmit signal. The transformed signal (the analog self-interference cancellation signal) preferably represents at least a part of the self-interference component received at the receiver 110.

The analog self-interference canceller 140 is preferably adaptable to changing self-interference parameters in addition to changes in the analog transmit signal; for example, RF transceiver temperature, ambient temperature, antenna configuration, humidity, and RF transmitter power. Adaptation of the analog self-interference canceller 140 is preferably performed by a tuning circuit, but may additionally or alternatively be performed by a control circuit or other control mechanism included in the canceller 140, such as the controller 170, or any other suitable controller.

Figure 4:
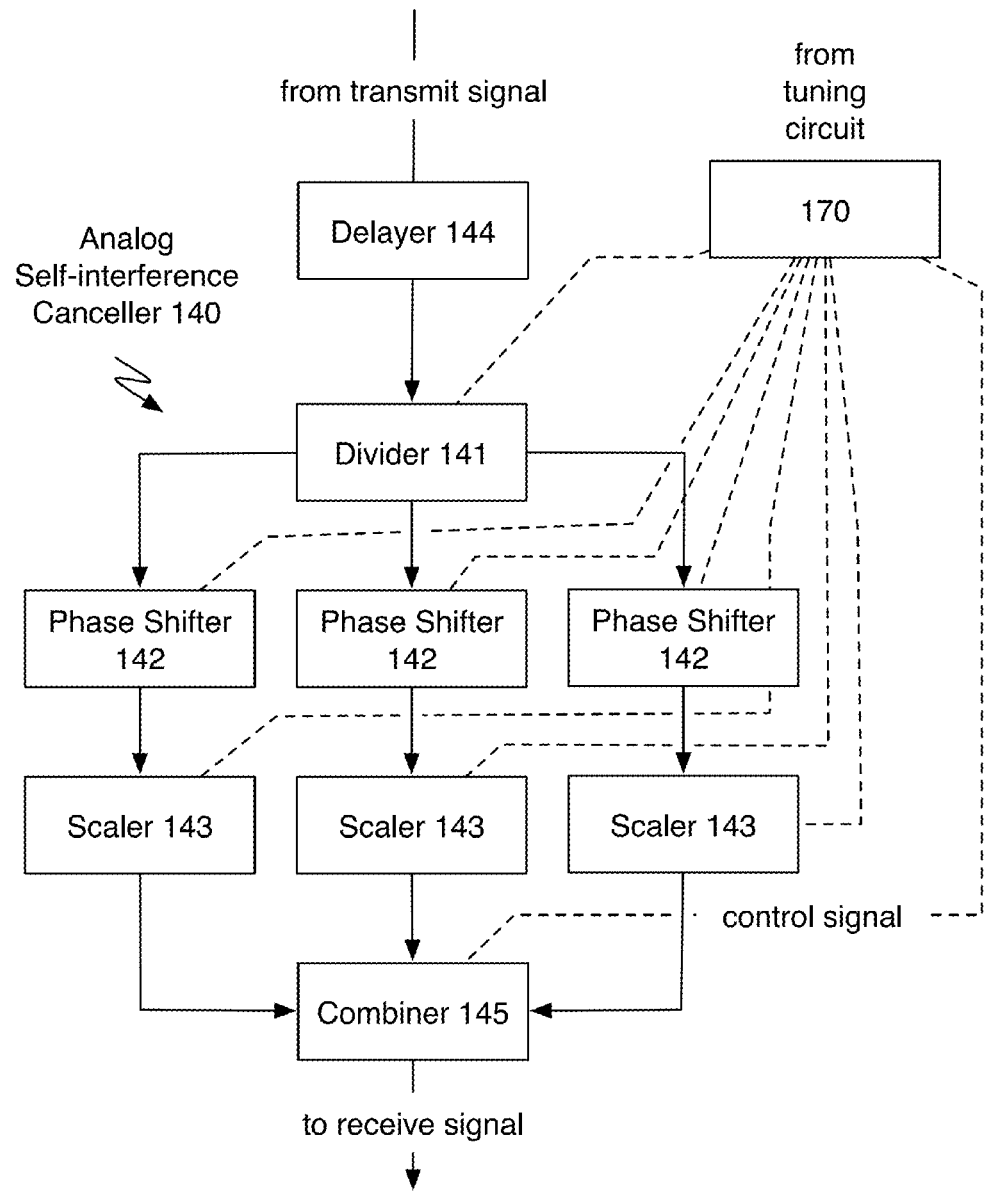
FIG. 4 is a schematic representation of an analog self-interference canceller of a system of a preferred embodiment.

In one implementation of the preferred embodiment, the analog self-interference canceller 140 includes a signal divider 141, phase shifters 142, scalers 143, delayers 144, and a signal combiner 145, as shown in FIG. 4. In this implementation, the analog self-interference canceller 140 splits the transmit signal into signal paths using the signal divider 141 and transforms each of these signal paths (also referred to as 'taps') individually before recombining them at the signal combiner 145.

Note that in some cases, the signal paths can be filtered such that signal paths can operate on different frequency sub-bands. The frequency sub-bands can overlap in frequency; there can additionally or alternatively be multiple filters corresponding to the same frequency sub-band.

The analog self-interference canceller 140 preferably transforms each tap by phase-shifting (with the phase shifters 142) and scaling (with the scaler 143) the signal components of each tap. The components of the analog self-interference controller 140 be coupled in any manner that enables analog self-interference cancellation for the system 100. In one implementation of the analog self-interference controller 140, each tap includes both a phase shifter 142 and a scaler 143; in an alternate implementation, signal paths may include only one of a phase shifter 142 and a scaler 143 or neither.

Delayers 144 may be located at any place in signal paths in or coupled to analog self-interference canceller 140 blocks.

The signal divider 141 functions to split the transmit signal into multiple transmit signal paths. The signal divider 141 preferably splits the transmit signal into multiple transmit signals having substantially the same waveform as the input transmit signal and equal power; the signal divider 141 may additionally or alternatively split the transmit signal into multiple transmit signals having different power levels and/or containing different waveforms than the input transmit signal. The signal divider 141 is preferably a transmission line power divider, but may additionally or alternatively be any suitable power divider, splitter, or coupler. The signal divider 141 may additionally contain any suitable electronics for pre-processing the transmit signal; for example, the signal divider 141 may contain an amplifier to increase the power contained in one or more of the output transmit signals.

Each analog canceller 140 block preferably includes a signal divider 141; additionally or alternatively, analog canceller 140 blocks may share one or more signal dividers 141.

Each phase shifter 142 functions to shift the phase of a signal path of the analog self-interference canceller 140. Phase shifters 142 can allow the self-interference cancellation signal to reflect the contributions of multiple signal components with offset phases.

Figure 15:
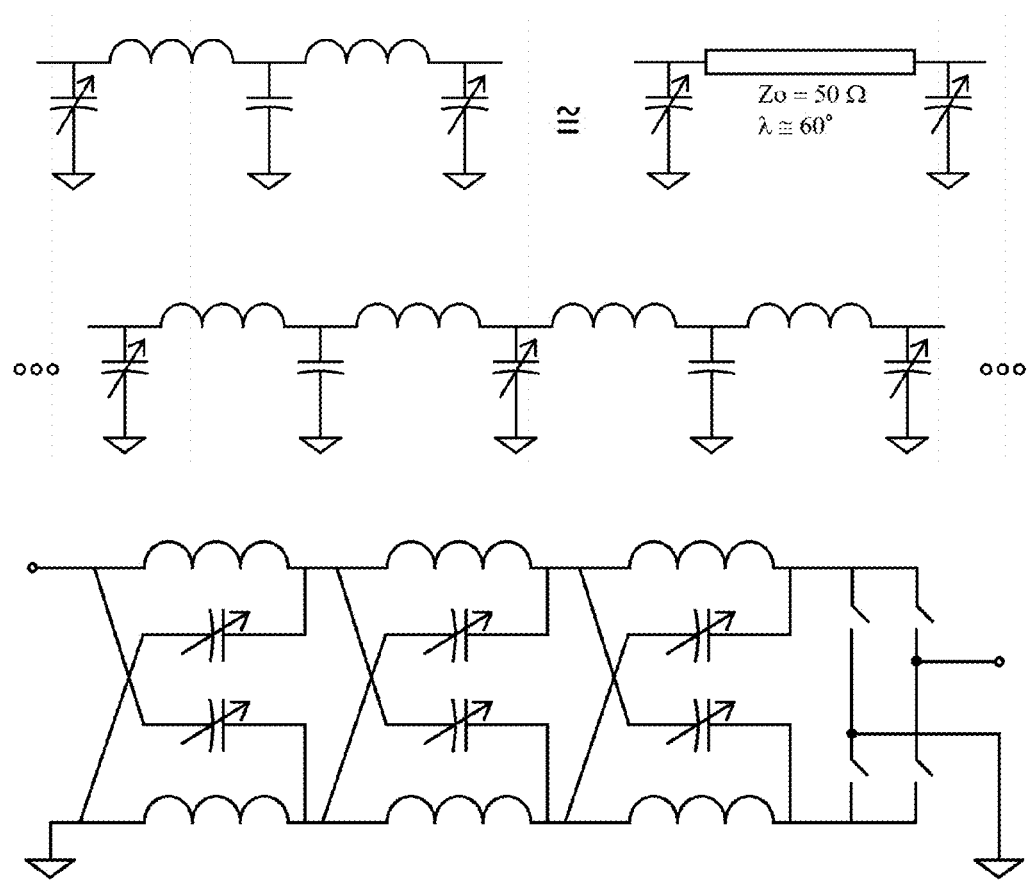
FIG. 15 is an example representation of phase shifters of an analog self-interference canceller of a system of a preferred embodiment.

Each phase shifter 142 preferably includes an impedance matching network at its input and output that compensates for variations in the phase shifter 142 input and output impedance (and/or phase shift amount) due to changes in signal component frequency or simply transforms the impedance to and from a suitable impedance level for the core of the phase shifter to a standardized impedance level (50 ohms). Alternatively, the phase shifter 142 may not include impedance matching networks. The impedance matching networks are preferably tunable (e.g., continuously or discretely variable) but may additionally or alternatively be static (i.e., the impedance transformation achieved by using the network is not variable). Some examples of phase shifter configurations are as shown in FIG. 15.

The phase shifter 142 is preferably separated into a set of phase shifting stages, which together preferably apply a total phase shift to the associated signal path. These phase shifting stages preferably may be switched 'on' (e.g., applied to the signal path) or 'off' (e.g., bypassed, out of signal path), depending on control signals (e.g., determined and sent by the controller 170). This may be implemented as a physical connection/disconnection in hardware (e.g., a switch, one or more transistors, etc.), firmware, and/or software. Changing the state of the phases shifting stages may additionally or alternatively be implemented in any suitable manner. The resulting phase shift induced by the phase shifter 142 can be determined by which stages are on and which stages are off. The stages may be configured such that multiple stages which are 'on' combine additively; for example, a phase shifter 142 with a 90-degree phase shifting stage and a 10-degree phase shifting stage, both of which are in the 'on' state, might cause a shift of 100 degrees in signal phase. Some stages may provide "negative" phase shift (e.g., −10 degrees) such that they can be additively combined with other phase shift stages to reduce the overall phase shift. Additionally or alternatively, the stages may be configured such that stages combine nonlinearly; for example, a stage providing a 10-degree phase shift in combination with a stage providing a 50-degree phase shift may provide an overall phase shift of 8 degrees. Additionally or alternatively, the stages may be configured such that various combinations of two or more stages in the 'on' or 'off' state provide any suitable total phase shift of the phase shifter 142.

Each phase shifting stage preferably causes a set amount (i.e., non-variable amount) of phase shift, but can alternatively shift the phase of the associated signal component by a variable amount. Such a phase shift can be generated by any suitable combination of circuit components. These components may be discrete (e.g., capacitors, inductors) or integrated (e.g., a single element with a fixed capacitance, inductance, and resistance), or any other suitable circuit components. For example, a phase shifting stage may comprise an LC network (e.g., an LC tank circuit), including an inductive element and a capacitive element, which is coupled to additional phase shifting stages by a coupling capacitive element. Alternatively, such LC network stages may be magnetically coupled together by an inductive element (e.g., the inductive element of the LC tank, a separate coupling inductor, etc.). Alternatively or additionally, phase shifting stages may include tunable phase-shift elements (e.g., tunable capacitors, tunable inductors, etc.). For example, a phase shifting stage may include a varactor; by changing a control voltage of the varactor, the varactor's capacitance (and thus the amount of phase shift experienced by a signal passing through the stage) may be varied. In a related example, each phase shifting stage can be coupled to another phase shifting stage by a shunt varactor (e.g., the phase shifting stages are arranged in series, and each series pair of phase shifting stages are coupled by shunt varactors).

Phase shifting stages can be configured to be used with various encoding schemes. An encoding scheme preferably specifies how phase shifting stages are to be configured in order to achieve a particular total phase shift value for a phase shifter 142. Preferably, this is accomplished by specifying the state (e.g., on or off) of each of a set of switches, each switch configured to disconnect and/or connect one of the phase shift stages from the signal pathway. Alternatively, this may be accomplished by adjusting the variable phase shift of each phase shifting stage, or in any other suitable manner. Several variations of encoding schemes can be used, such as binary encoding, thermometer encoding, and hybrid thermometer encoding. A binary encoding scheme may enable certain aspects of the phase shifter architecture, such as requiring fewer individual switches (e.g., bits) to obtain a particular overall phase shift of the phase shifter 142 compared to a fully-thermometer encoding scheme. A thermometer encoding scheme may enable other aspects, such as requiring fewer switching events (e.g., from the 'on' state to the 'off' state and vice versa) to alter the overall phase shift of the phase shifter 142, as well as monotonicity during phase shifter operation, compared to a fully binary encoding scheme. A hybrid thermometer encoding scheme preferably includes thermometer encoding for a subset of the phase shifting stages of the phase shifter 142, and binary encoding for another subset of the phase shifting stages of the phase shifter 142, so as to take advantage of certain aspects of binary encoding in combination with other particular aspects of thermometer encoding. Thus, a hybrid thermometer encoding scheme combines attributes of the binary scheme and the thermometer scheme in order to include the desired aspects of both.

An example of a phase shifter implementing a binary encoding scheme may include: a four-stage binary encoded phase shifter 142 configured to have 16 phase shift values. That is, the phase shifter may have phase shift values corresponding to binary numbers, which in turn correspond to specific phase shift stage states, such as: 0000 (0 degree shift), 0001 (2 degree shift), 0010 (4 degree shift) . . . 1111 (32 degree shift). In contrast, an example of a phase shifter implementing a thermometer encoding scheme may include: a four-stage thermometer encoded phase shifter configured to have five phase shift values. That is, the phase shifter may have phase shift values corresponding to thermometer encoded numbers, which in turn correspond to specific phase shift stage states, such as: 0000 (0 degree shift), 0001 (2 degree shift), 0011 (4 degree shift), 0111 (6 degree shift), 1111 (8 degree shift). An example of a phase shifter implementing a hybrid thermometer encoding scheme may include eight stages, wherein the first four stages are encoded as in the binary encoded phase shifter described above and the latter four stages are encoded as in the thermometer encoded phases shifter above. Alternative phase shifters also implementing a hybrid thermometer encoding scheme can include any suitable number of stages, with any suitable division between the number of binary-encoded stages and the number of thermometer-encoded stages (e.g., 59 stages, wherein 7 stages are binary encoded and 52 stages are thermometer encoded).

A hybrid thermometer encoded scheme preferably combines attributes of the binary scheme and the thermometer scheme, preferably in order to increase the advantageous aspects of both. For example, a hybrid thermometer scheme might include several stages with large phase change effects that are switched according to a binary scheme, while stages with smaller phase change effects may be switched according to a thermometer scheme. In this way, stages that may require switching less frequently (e.g., those stages that may apply large phase shift changes) are compactly encoded by a binary scheme (i.e., requiring fewer switches), while stages that may need frequent switching (e.g., those stages that contribute small phase shift changes) are encoded by a time-efficient and monotonic thermometer scheme. This may, in some implementations, prevent stages from being cycled (i.e., switched on and off) unnecessarily for small changes in phase shift and preserves monotonicity during phase shifter 142 operation (an aspect of the thermometer encoding that may not be present in the binary encoding). In this way, a phase shifter 142 utilizing hybrid thermometer encoding can preserve desirable aspects of thermometer coding (e.g., monotonicity, which results in a smaller lookup table and fewer iterations for the algorithm) while also incorporating desirable aspects of binary encoding (e.g., reducing the overall number of stages needed to perform phase shifting).

In a variation of a preferred embodiment, the controller 170 generates a desired phase shift output of the phase shifter, and encodes the desired phase shift output into a discrete phase shift value according to the hybrid thermometer encoding scheme described above. The discrete phase shift value may, in some implementations, be an approximation of the desired phase shift output based on the configuration of the phase shifter 142. For example, predetermined phase shift values of each of the phase shift stages may permit a range of discrete total phase shift values, and the encoded discrete phase shift value may thus be greater or less than the desired phase shift output by a finite amount. In another example, the hybrid thermometer encoding scheme may transform the desired phase shift output into a discrete phase shift output according to a phase shift curve, and the set of available configurations of the phase shift stages may approximate the phase shift curve in a piecewise linear manner. The controller 170 preferably adjusts the total phase shift value of the phase shifter according to the discrete phase shift value thus encoded, preferably by way of activating a subset of the phase shift stages. However, the total phase shift value of the phase shifter may alternatively or additionally be adjusted in any suitable manner.

Note that hybrid thermometer schemes having different parameters may be selected from by the controller 170. For example, the controller 170 may select a first hybrid thermometer encoding scheme intended to minimize reflection coefficients or a second hybrid thermometer encoding scheme intended to maximize cancellation performance. The controller 170 may automatically select a scheme based on any suitable information; for example, the reflection coefficient minimization scheme may be selected automatically if coefficients of reflection rise above a set threshold. The controller 170 may select or otherwise modify encoding schemes in any manner (automatically, manually, etc.) based on any suitable information.

In another variation of a preferred embodiment, the controller 170 increments the total phase shift value of the phase shifter 142 during operation. In this variation, the total phase shift value is incremented according to a series of steps (e.g., increments) which are computed according to a hybrid thermometer code. The steps may additionally or alternatively be computed according to a phase shift curve, such that incrementing the total phase shift value results in a total phase shift value of a discrete phase shift value along the curve. In some implementations, coarse increments of the total phase shift value (or along the phase shift curve) are computed according to a binary component of the hybrid thermometer code, and fine increments are computed according to a thermometer component of the hybrid thermometer code. For example, the binary component may be used to increment the phase shifter in increments of 10° of phase shift, and the thermometer component may be used to increment the phase shifter in increments of 1° of phase shift. In another example, a first subset of the series of steps corresponding to coarse increments (e.g., increments of 15°, 45°, and 90° of phase shift) are computed according to the binary component, and a second subset of steps corresponding to fine increments (e.g., increments of 0.5°, 1°, and 5° of phase shift) are computed according to the thermometer component. In general, coarse increments are preferably any increment greater than any fine increment, but coarse and/or fine increments can additionally or alternatively be any suitable increment.

In another variation of a preferred embodiment, the phase shifter 142 may be limited in phase shifting at certain center frequencies. At frequencies higher than the minimum design frequency, full utilization of the phase shifter 142 (i.e., all phase shifting stages active) may result in phase shifts greater than 360 degrees. For center frequencies at which full phase shifter utilization may result in greater-than-360-degree phase shift, the phase shifter 142 may be blocked from full utilization (e.g., some bits of the thermometer encoding may not be used at those center frequencies).

The scalers 143 function to scale transmit signal components; specifically, the scalers 143 effectively multiply the transmit signal components by a scale factor. For example, an attenuation of 34% might be represented as a scale factor of 0.66; a gain of 20% might be represented as a scale factor of 1.20; and an attenuation of 10% and a phase inversion might be represented as a scale factor of −0.90. Scale factors may be complex; for example, a scale factor of $e^{(i*Pi/2)}$ might be represented as a phase shift of ninety degrees. The scalers 143 provide the weighting for the combination of self-interference components at the signal combiner 145 (e.g., a signal with scale factor 2 is weighted twice as heavily as one with a scale factor of 1).

Figure 5:
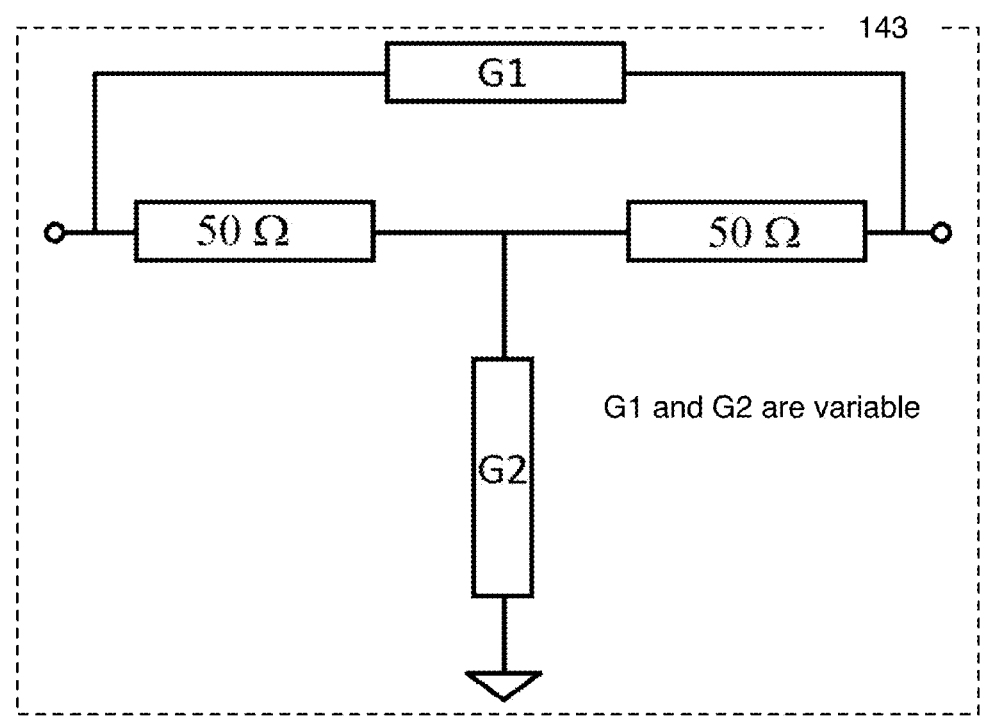
FIG. 5 is a schematic representation of an attenuator of an analog self-interference canceller of a system of a preferred embodiment.

The scalers 143 may include attenuators (e.g., as shown in FIG. 5), amplifiers, phase inverters, and/or any other suitable components for scaling transmit signal components. Attenuators may be resistive attenuators (T pad, Pi pad, Bridged-T), capacitive dividers, amplifiers with less than unity gain, or any other suitable type of attenuator. Amplifiers may be transistor amplifiers, vacuum tube amplifiers, op-amps, or any other suitable type of amplifier. Phase inverters may be any phase inversion devices, including NPN/PNP phase inversion circuits, transformers and/or inverting amplifiers.

The scalers 143 preferably are capable of attenuation, gain, and phase inversion, but may alternatively be capable only of a subset of said capabilities. Each scaler 143 preferably includes all three capabilities in a single device (e.g., an amplifier with tunable gain and two outputs, one inverted and one non-inverted) but may additionally or alternatively separate capabilities into different sections (e.g., an amplifier with tunable gain but no inversion capability, along with a separate phase inversion circuit). The scalers 143 are preferably controlled by a tuning circuit, but may additionally or alternatively be controlled in any suitable manner.

In a variation of a preferred embodiment, the scalers 143 comprise digital step attenuators (DSAs). In some implementations, each DSA preferably includes an impedance matching network at its input and output that compensates for variations in the DSA input and output impedance (and/or attenuation amount) due to changes in signal component frequency; additionally or alternatively, the DSA may transform the impedance from a suitable impedance level for the switching block of the DSA to a standardized impedance level (e.g., 50 ohms) and vice versa. Alternatively, the scaler 143 may not include impedance matching networks. The impedance matching networks are preferably tunable (e.g., continuously or discretely variable) but may additionally or alternatively be static (i.e., the impedance transformation achieved by using the network is not variable).

A portion of the scaler 143 (e.g., the series impedance G1 and/or shunt impedance G2 of FIG. 5) is preferably separated into a set of attenuation stages. These attenuation stages preferably may be switched 'on' (e.g., in signal path) or 'off' (e.g., out of signal path), depending on control signals. The resulting attenuation is determined by which stages are on and which stages are off; for example, a scaler 143 with a 4 dB attenuation stage and an 8 dB attenuation stage 'on' might cause an attenuation of 12 dB. Alternatively, the scaler 143 may not be separated into a set of stages.

Each attenuation stage preferably causes a set amount (i.e., non-variable amount) of attenuation. Alternatively, attenuation stages may include tunable elements. For example, an attenuation stage may include a voltage controlled resistor (e.g. realized with a FET); by changing the control voltage of this stage, the resistance (and thus the amount of attenuation experienced by a signal passing through the stage) may be varied.

Similarly to the phase shifter 142, the scaler 143 is preferably configured to be controlled by a hybrid thermometer encoding scheme, preferably by way of the controller 170 (though additionally or alternatively by any suitable control means). The hybrid thermometer encoding scheme is preferably a hybrid of binary and thermometer encoding schemes; in one implementation of a preferred embodiment, binary encoding is used for large attenuation values (or coarse attenuation increments), while thermometer encoding is used for smaller values (or fine attenuation increments).

Figure 6:
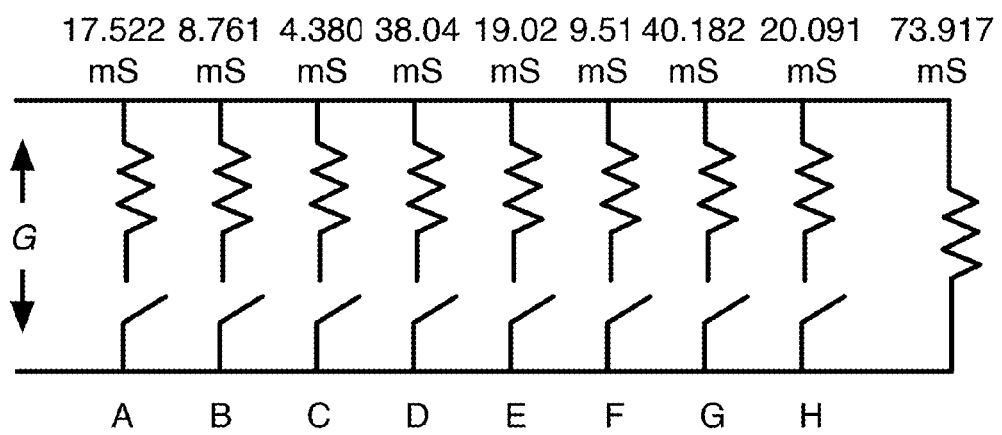
FIG. 6 is an example representation of piecewise linear approximation for series conductance of a bridged T attenuator of a system of a preferred embodiment.

In some variations, the number of switches forming the DSA may be reduced by using (for example) only shunt switches for a partial range of the DSA and selecting resistor values such that they represent a piecewise linear change of the attenuation. Accordingly the number of switches may be reduced by implementing only series switches for a partial range of the DSA and selecting resistor values such that provide a piecewise linear change in attenuation, as shown in FIG. 6. For example, branches A through F may follow a thermometer code (with only one switch closed at a time), whereas branches G and H may be operated in binary mode. As another example, A-C and G-H might be thermometer coded, while D-F are operated in binary mode.

In another variation, the controller 170 preferably increments the total scale factor of the scaler 143 according to a series of steps, wherein the series of steps is computed according to a hybrid thermometer code (analogously to the steps discussed above in relation to the phase shifter 142). The series of steps in the case of the scaler 143 are steps and/or increments of scale factor, as opposed to increments of phase shift as in the case of variations of the phase shifter 142. The hybrid thermometer code in the case of the scaler 143 may be the same hybrid thermometer code as in the case of phase shifter 142, though alternatively it may be a different hybrid thermometer code (e.g., a second hybrid thermometer code). Additionally or alternatively, incrementing of the scale factor of the scaler 143 may be done according to any suitable encoding or set of instructions, and may be implemented by the controller 170 or any other suitable component.

The scaler 143 can additionally include a capacitive (or inductive or both) compensation network to compensate for parasitic capacitances in the analog self-interference canceller 140. This capacitive network can be independent of or coupled to attenuation stages of the scaler or DSA; in one embodiment, capacitors of the compensation network can be lumped or otherwise combined (partially or fully) with attenuation branches (resistors or switches) of the scaler 143. In another embodiment lumped inductors can be placed in series with the stages in the signal path to improve the frequency response of scaler and phase shifter.

The delayers 144 function to delay transmit signal components, preferably to match corresponding delays in received self-interference. The delay introduced by each delayer 144 (also referred to as a delayer delay) is preferably fixed (i.e., the delayer 144 is a fixed delayer), but delayers 144 can additionally or alternatively introduce variable delays. The delayer 144 is preferably implemented as an analog delay circuit (e.g., a bucket-brigade device, a long transmission line, a series of RC networks or a filter) but can additionally or alternatively be implemented in any other suitable manner. If the delayer 144 is a variable delayer, the delay introduced is preferably set by a tuning circuit, but can additionally or alternatively be set in any suitable manner.

Each delayer 144 preferably includes an impedance matching network at its input and output that compensates for variations in the delayer 144 input and output impedance (and/or delay amount) due to changes in signal component frequency or transforms the impedance to and from a suitable impedance level for the core of the delayer to a standardized impedance level (50 ohms). Alternatively, the delayer 144 cannot include impedance matching networks. The impedance matching networks are preferably tunable (e.g., continuously or discretely variable) but can additionally or alternatively be static (i.e., the impedance transformation achieved by using the network is not variable).

Figure 7A:
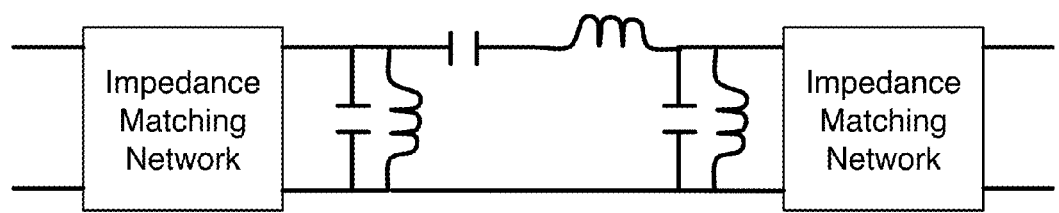
FIGS. 7A and 7B are schematic representations of delayers of an analog self-interference canceller of a system of a preferred embodiment.
Figure 7B:
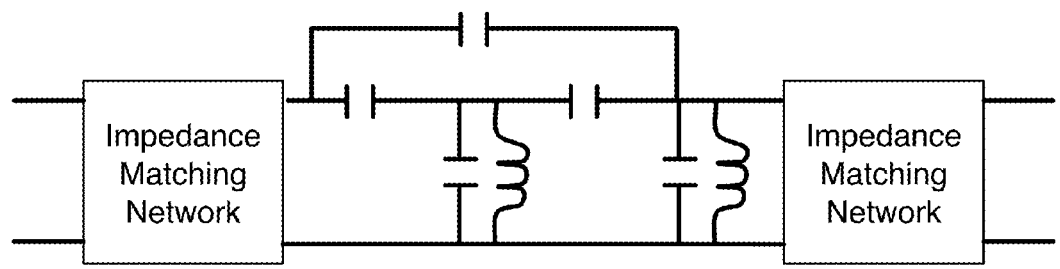
Figure 14:
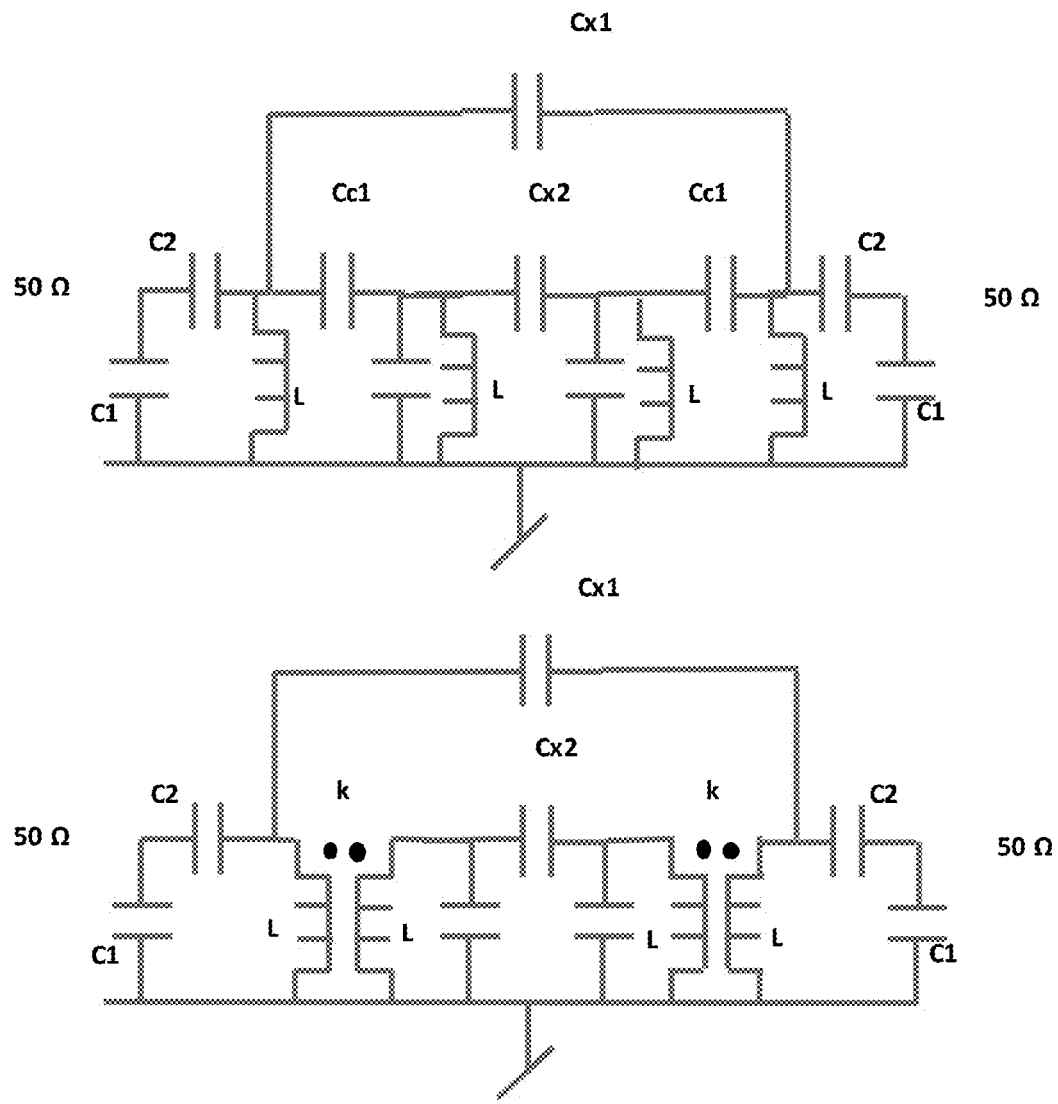
FIG. 14 is an example representation of delayers of an analog self-interference canceller of a system of a preferred embodiment.

In one example of a preferred embodiment, the delayer 144 uses a coupled shunt tank architecture (as shown in FIG. 7A) which requires significantly different inductors in the series and shunt path. Alternatively, the delayer 144 can use a modified delayer architecture (with only shunt and not series inductors), as shown in FIG. 7B. Similarly the delayer 144 can only use series inductors. The delayer 144 can additionally or alternatively use any circuit architecture; further examples are as shown in FIG. 14.

In a variation of a preferred embodiment, the shunt capacitance can be substituted for by several LC components or resonators (or multiple of any inductors and/or capacitors) connected in parallel; in this variation, smaller capacitors can be used (as the total capacitance is the sum of the parallel capacitances) and larger inductors can be used (as the total inductance is the reciprocal of the sum of the reciprocals of the individual inductors).

Note that changes in phase shift can affect delays (and vice versa), so the phase shifter 142 and delayer 144 are preferably tuned cooperatively (e.g., if a phase shifting value is changed, a delayer value can also be changed to compensate for unintended delays introduced by the phase shift).

After transformation by a scaler 143 and/or a delayer 144, transmit signal components are transformed into self-interference cancellation signal components, which can be combined to form a self-interference cancellation signal.

The signal combiner 145 functions to combine the self-interference cancellation signal components into an analog self-interference cancellation signal; the analog self-interference cancellation signal can then be combined with an analog receive signal to remove self-interference. The signal combiner 145 preferably combines self-interference cancellation signal components (resulting from multiple signal paths) and outputs the resulting analog self-interference cancellation signal. The signal combiner 145 is preferably a transmission line coupler, but can additionally or alternatively be any suitable type of coupler (described in the signal coupler 130 sections). The signal combiner 145 can additionally contain any suitable electronics for post-processing the self-interference cancellation signal before outputting it; for example, the signal combiner 145 can contain an amplifier to increase the power of the self-interference cancellation signal.

The signal path can also contain one or more linearization circuits to compensate for non-linearity generated in the self-interference canceller; as for example in amplifiers, switches, mixers, scalers, phase shifters and delayers.

Figure 8:
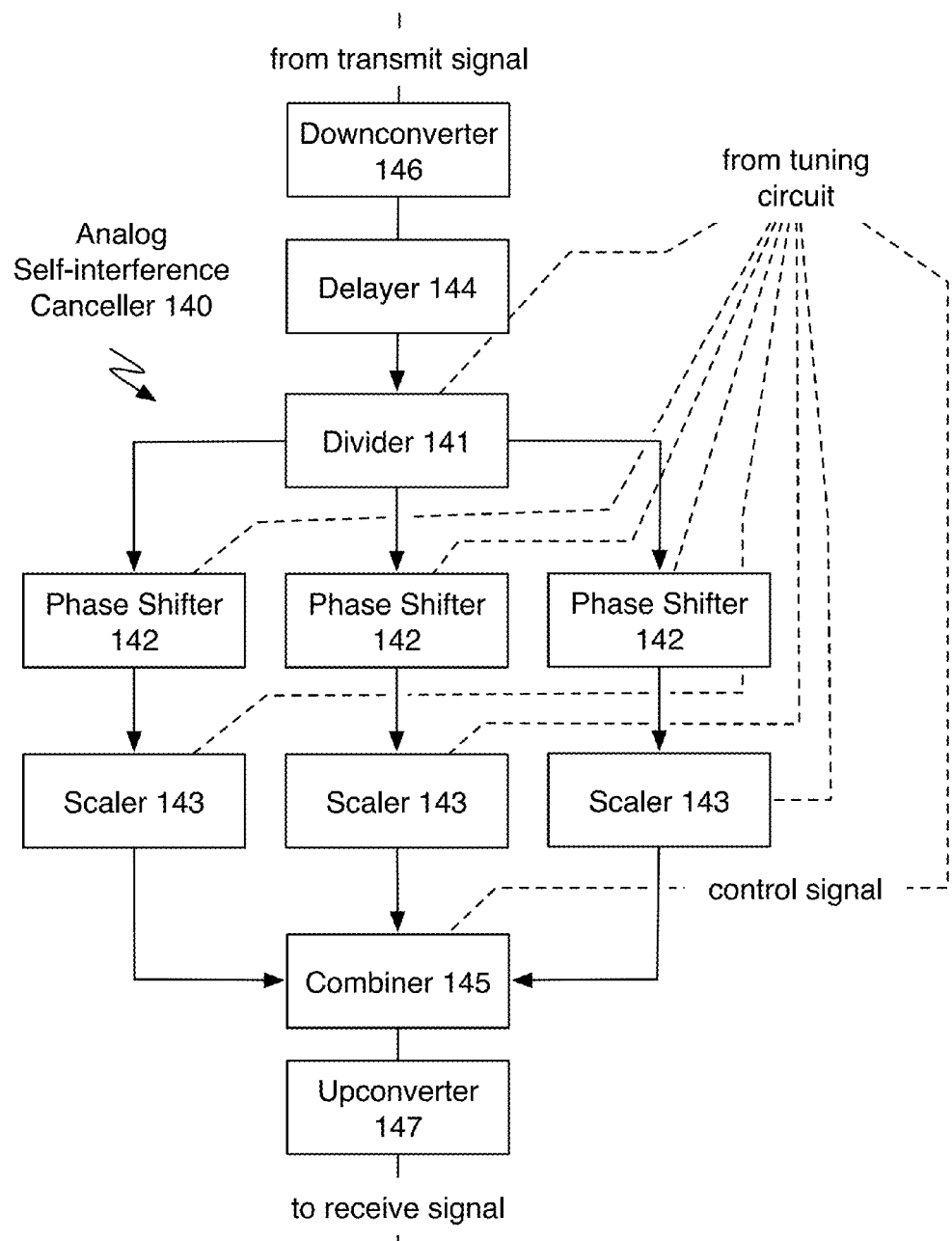
FIG. 8 is a schematic representation of an analog self-interference canceller of a system of a preferred embodiment.

As previously mentioned, the analog self-interference canceller 140 can perform self-interference cancellation at either or both of IF or RF bands. If the analog self-interference canceller 140 performs cancellation at IF bands, the analog self-interference canceller 140 preferably includes a downconverter 146 and an upconverter 147, as shown in FIG. 8.

The downconverter 146 functions to downconvert the carrier frequency of an RF transmit signal (the analog transmit signal sampled by a signal coupler 130 to an intermediate frequency (or, in some cases, baseband (IF=0 Hz)) preparing it for transformation by the analog canceller 140. The downconverter 146 is preferably communicatively coupled to the RF transmit signal by the transmit coupler 130, and the analog canceller 140, and preferably receives RF transmit signals from the transmit coupler 130, downconverts the signal to an intermediate frequency, and passes the resulting IF transmit signal to the analog canceller 140. The downconverter 146 is preferably substantially similar to the downconverter of the receiver 110 (although details such as LO frequency, linearity and filter configuration can differ between the two), but can additionally or alternatively be any suitable frequency downconverter.

The upconverter 147 functions to upconvert the carrier frequency of the IF self-interference signal (received from the analog canceller 140) to a radio frequency, preparing it for combination with the RF receive signal at the receiver coupler 160. The upconverter 147 is preferably communicatively coupled to the receive coupler 160 and the analog canceller 140, and preferably receives IF self-interference cancellation signals from the analog canceller 140, upconverts the signal to a radio frequency, and passes the resulting RF self-interference cancellation signal to the receive coupler 160.

The digital self-interference canceller 150 functions to produce a digital self-interference cancellation signal from a digital transmit signal. The digital self-interference cancellation signal is preferably converted to an analog self-interference cancellation signal (by a DAC) and combined with the analog self-interference cancellation signals to further reduce self-interference present in the RF receive signal at the receiver 110. Additionally or alternatively, the digital self-interference cancellation signal can be combined with a digital receive signal.

The digital self-interference canceller 150 preferably samples the RF transmit signal of the transmitter 120 using an ADC (additionally or alternatively, the canceller 150 can sample the digital transmit signal or any other suitable transmit signal) and transforms the sampled and converted RF transmit signal to a digital self-interference signal based on a digital transform configuration. The digital transform configuration preferably includes settings that dictate how the digital self-interference canceller 150 transforms the digital transmit signal to a digital self-interference signal (e.g. coefficients of a generalized memory polynomial used to transform the transmit signal to a self-interference signal).

The digital self-interference canceller 150 can be implemented using a general-purpose processor, a digital signal processor, an application specific integrated circuit (ASIC), a field programmable gate array (FPGA) and/or any suitable processor(s) or circuit(s). The digital self-interference canceller 150 preferably includes memory to store configuration data, but can additionally or alternatively be configured using externally stored configuration data or in any suitable manner. In one implementation, the digital self-interference canceller 150 is substantially similar to the digital self-interference canceller of U.S. patent application Ser. No. 14/456,320, filed 11 Aug. 2014, which is incorporated in its entirety by this reference.

The digital self-interference canceller 150 can couple to transmit and receive signals in a number of ways. For example, the digital self-interference canceller 150 can use a converted RF transmit signal as input as well as provide a converted digital self-interference cancellation signal as output. As another example, the digital self-interference canceller 150 can use the digital transmit signal as input as a well as provide a digital self-interference cancellation signal as output (directly to the digital receive signal). The digital self-interference canceller can additionally or alternatively couple to transmit signals in any combination of digital and analog receive signals.

Note that while these examples reference the RF transmit signal and RF receive signal, the digital self-interference canceller 150 can additionally or alternatively couple to IF transmit signals and/or IF self-interference cancellation signals.

The receive coupler 160 functions to combine one or more analog self-interference cancellation signals (from analog/digital cancellers) with the analog receive signal.

The receive coupler 160 is preferably a short section directional transmission line coupler, but can additionally or alternatively be any power divider, power combiner, directional coupler, or other type of signal splitter. The receive coupler 160 is preferably a passive coupler, but can additionally or alternatively be an active coupler (for instance, including power amplifiers). For example, the receive coupler 160 can comprise a coupled transmission line coupler, a branch-line coupler, a Lange coupler, a Wilkinson power divider, a hybrid coupler, a hybrid ring coupler, a multiple output divider, a waveguide directional coupler, a waveguide power coupler, a hybrid transformer coupler, a cross-connected transformer coupler, a resistive tee, and/or a resistive bridge hybrid coupler. The output ports of the receive coupler 160 are preferably phase-shifted by ninety degrees, but can additionally or alternatively be in phase or phase shifted by any amount (e.g., zero degrees, 180 degrees).

The controller 170 functions to control the analog self-interference canceller, and in particular components thereof (e.g., the phase shifter(s), the scaler(s), etc.). The controller 170 can additionally or alternatively function to control any portion of the system 100.

3. Integrated Self-Interference Cancellation System Configurations

The system 100, as discussed in section 2, can be structured in a variety of ways to effect integration—which can provide a number of benefits, including reducing PCB complexity/cost and increasing system 100 flexibility.

Figure 9:
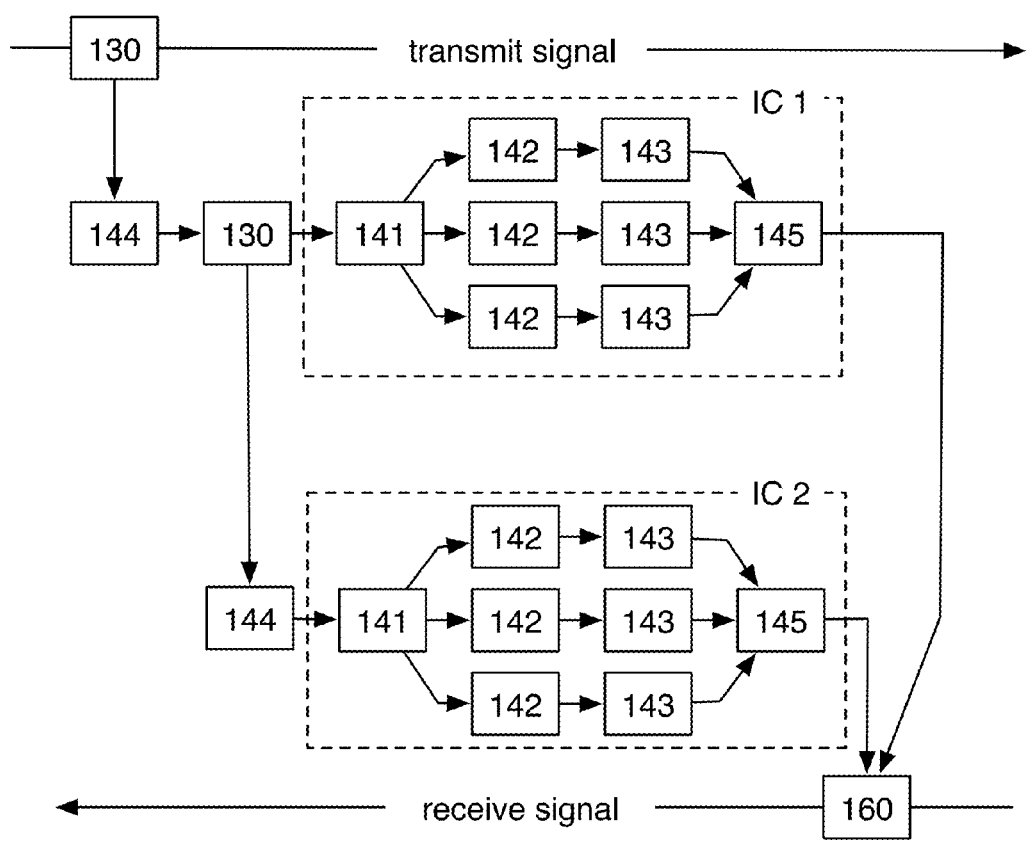
FIG. 9 is an example representation of horizontal integration of an analog self-interference canceller of a system of a preferred embodiment.
Figure 10:
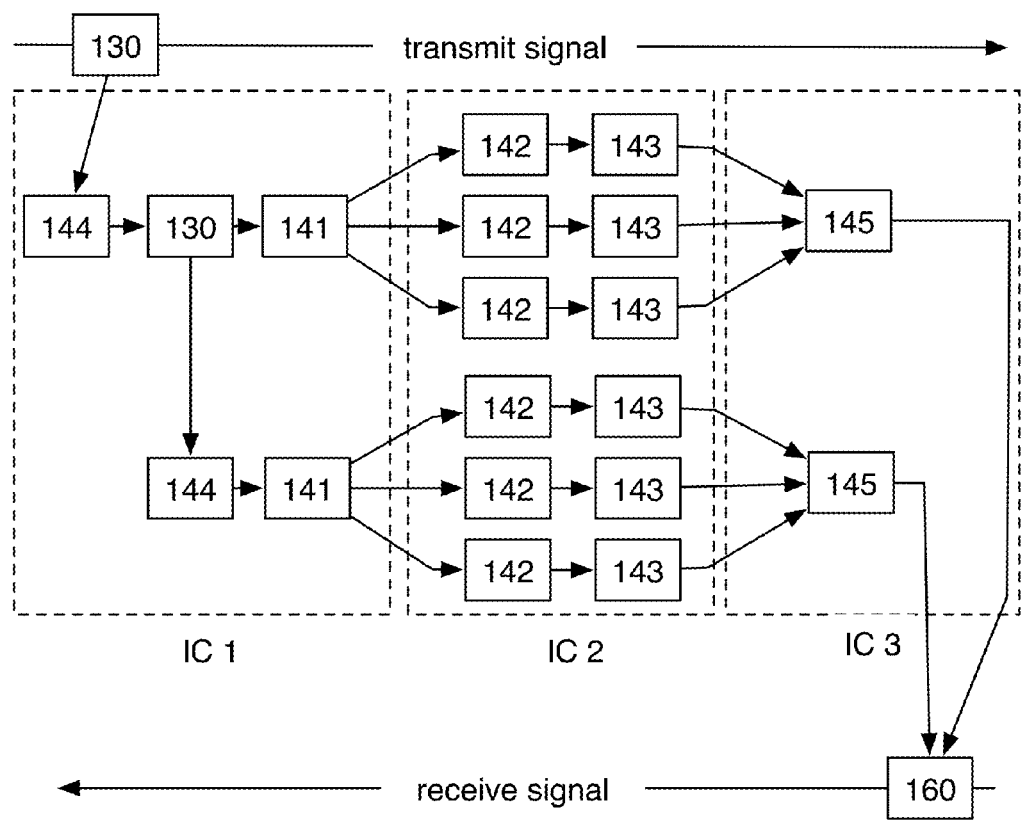
FIG. 10 is an example representation of vertical integration of an analog self-interference canceller of a system of a preferred embodiment.

In particular, the system 100 preferably uses one or both of vertical integration and horizontal integration to integrate components of the analog self-interference canceller 140 (and/or other components of the system 100) into analog integrated circuits. As referred to in this application, horizontal integration refers to integration along a signal path of the analog self-interference canceller 140; for example, integrating phase shifters 142 and DSAs 143 into analog ICs. Vertical integration refers to integrating multiple components of the same type across signal paths (e.g., grouping phase shifters 142 of multiple signal paths together. An example of horizontal integration is as shown in FIG. 9, while an example of vertical integration is as shown in FIG. 10. In variations, the system 100 can include a substrate (e.g., a printed circuit board) to which various components (e.g., integrated circuits, sub-circuits, etc.) are coupled.

In a specific implementation, the system 100 includes a set of scalers 143 and a set of phase shifters 142. Each of the set of scalers and each of the set of phase shifters includes an input and an output. In this implementation, the set of scalers are integrated into a first analog integrated circuit that includes a set of IC outputs, such that each of the set of IC outputs corresponds to an output of one of the scalers. Similarly, the set of phase shifters are integrated into a second analog integrated circuit that includes a set of IC inputs, such that each of the set of IC inputs corresponds to an input of one of the phase shifters. In this implementation, the first and second analog integrated circuits are both coupled to the substrate, and the set of IC outputs is connected to the set of IC inputs. This specific implementation thus includes ICs packaged to include aspects of vertical integration as described above. The first and second analog integrated circuits may additionally or alternatively include inputs and outputs for the purposes of control of the phase shifters 142 and/or the scalers 143 (e.g., by the controller 170).

In another specific implementation, the system 100 includes an analog integrated circuit made up of a scaler 143 and a phase shifter 142, wherein the output of the scaler 143 is connected to the input of the phase shifter 142. The analog integrated circuit of this implementation preferably has a circuit input and a circuit output, coupled to the scaler input and the phase shifter output, respectively. Thus, in this implementation, the analog integrated circuit is packaged so as to include aspects of horizontal integration. The analog integrated circuit of this implementation may additionally or alternatively include inputs and/or outputs for the purposes of control and/or monitoring, respectively (e.g., by the controller 170).

Figure 11:
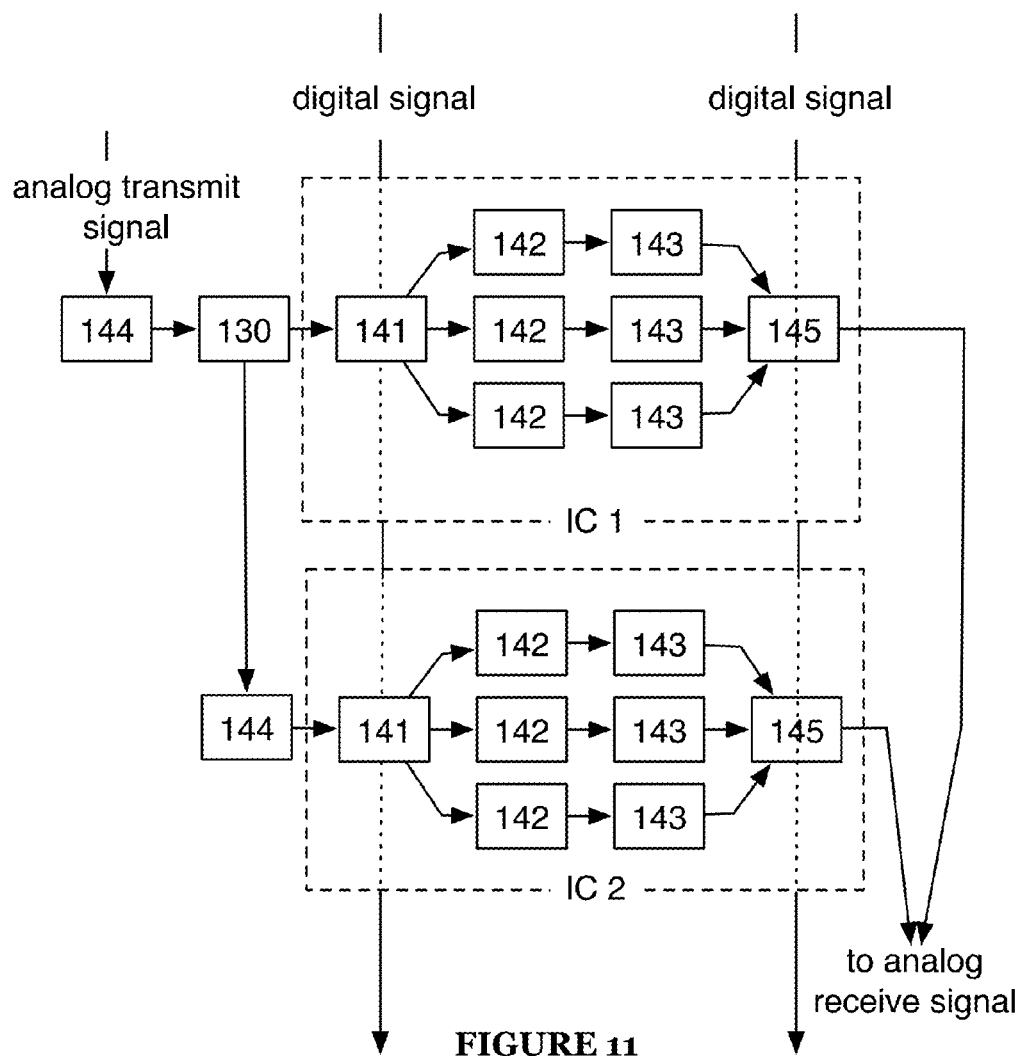
FIG. 11 is an example representation of digital passthroughs integrated in an analog self-interference canceller of a system of a preferred embodiment.
Figure 12:
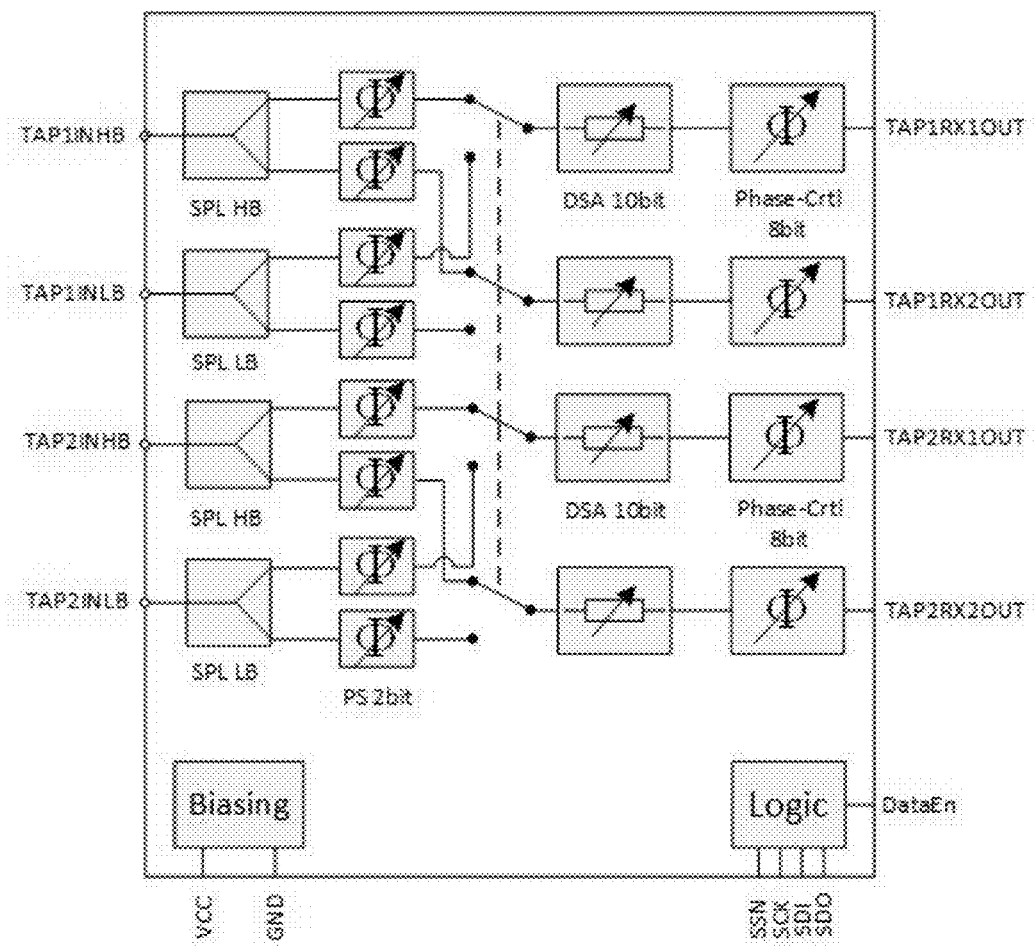
FIG. 12 is an example representation of integration of an analog self-interference canceller of a system of a preferred embodiment.

In another variation of a preferred embodiment, analog IC blocks (additionally or alternatively, analog ICs) can include digital passthroughs (e.g., using buffers inside the analog IC blocks) to pass digital control signals through IC blocks, allowing digital and analog signals to be routed on the same PCB layer and hence reducing the complexity and cost of the PCB, as shown in FIG. 11.

Note that in FIGS. 9 and 10 the system 100 includes multiple transmit couplers 130 arranged in series. The system 100 preferably includes multiple transmit couplers arranged according to a power profile; that is, a profile of the coupling factors of each of the transmit couplers 130. For example, one power profile can include a 10 dB coupler and a 5 dB coupler in series (or in parallel), directed to two analog cancellers 140 blocks. Power profiles are preferably altered (by changing coupler 130 coupling factors or connections) in response to changing center frequencies; for example, while the above power profile can be appropriate for a center frequency of 1.5-2 GHz, a denser power profile can be more appropriate for a center frequency of 1 GHz (e.g., three couplers at 10 dB, 7 dB, and 5 dB). This change of power profile can be similarly adjustable as scaler, phase shifter and delayer and tunable by the self-interference canceller's controller.

In a first variation, the set of transmit couplers are coupled to the transmit signal and the analog self-interference canceller in a specified configuration, determined according to a desired power profile by the controller 170. For example, the controller 170 may adjust the coupling factor of a number of the set of transmit couplers, in variations in which the coupling factor is adjustable. In another example, the controller 170 may selectively activate a subset of the set of transmit couplers, according to the coupling factors of the subset, in order to produce a desired resulting power profile. In a further example, the coupling factor of each of the transmit couplers may be selectable, and the controller may select the coupling factor of each transmit coupler in order to produce a desired power profile. In each of these examples, the operation of the controller (e.g., activating, selecting) may equivalently be described as selecting the specified configuration of the set of transmit couplers.

Figure 16A:
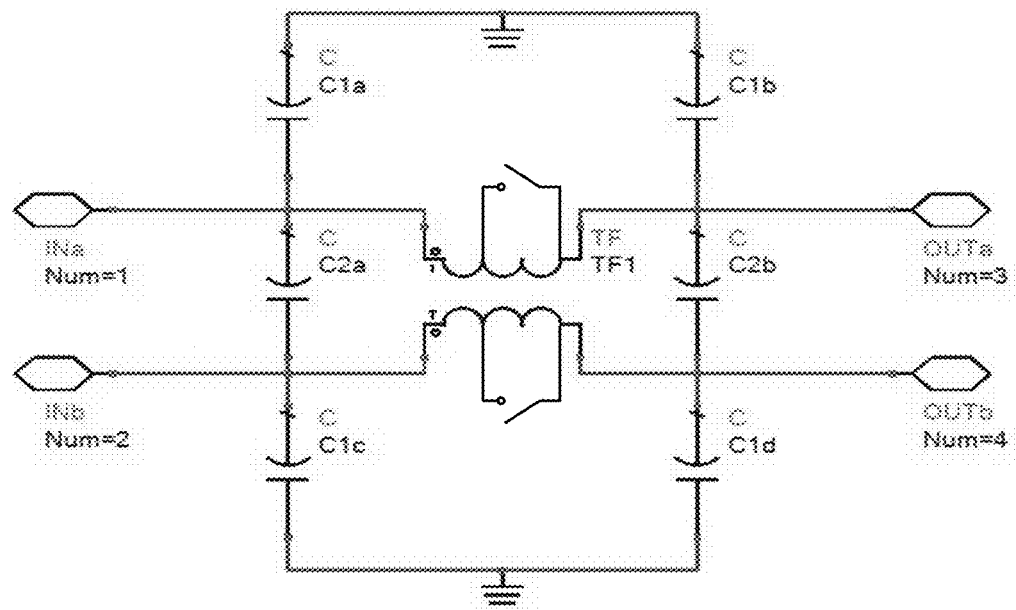
FIGS. 16A and 16B are example implementations of tunable couplers of a system of a preferred embodiment.
Figure 16B:
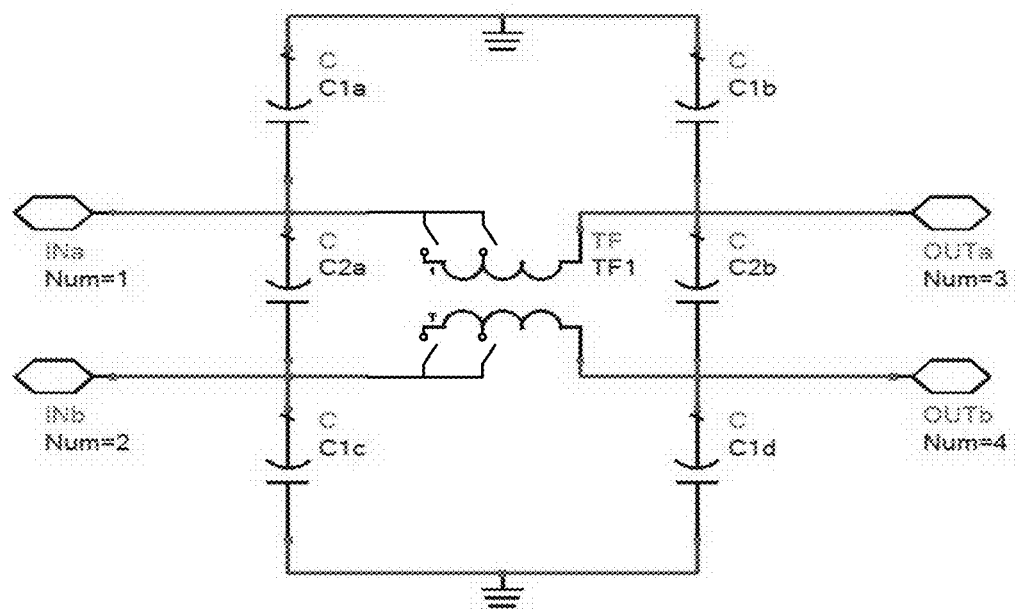

As shown in FIG. 16A, a first implementation of a tunable transmit coupler is tunable by selectively shorting turns of coupling inductors. As shown in FIG. 16B, a second implementation of a tunable transmit coupler is tunable by selectively switching between tapping points of an inductor. A person of ordinary skill in the art will recognize that these tunable transmit couplers may be controlled via the controller 170 in any manner (e.g., using MOSFETs to switch tapping points or open/close shorting elements).

Figure 13A:
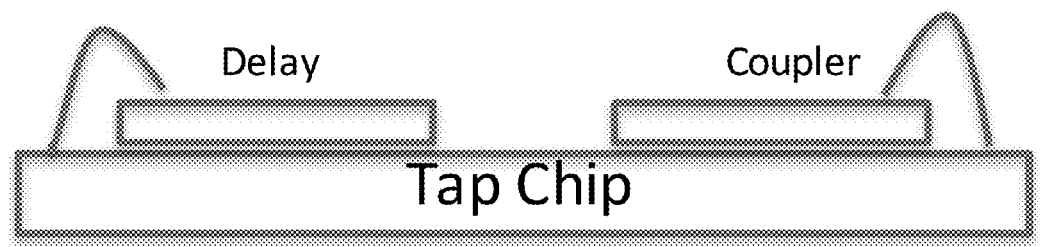
FIGS. 13A and 13 B are example representations of integration of an analog self-interference canceller of a system of a preferred embodiment.
Figure 13B:
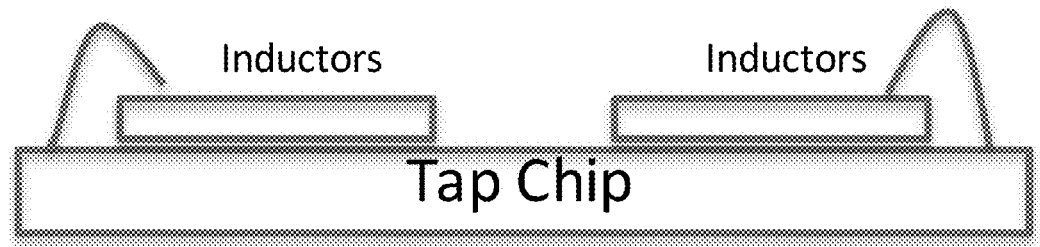

The aforementioned blocks and subsystems can be integrated vertically or laterally either on a single die, a SoC or SIP, multi-chip module or a typical module. For example, an SIP structure can have a complete DSA and phase shifter on chip with delayers and/or couplers mounted on top as shown in FIG. 13A; another SIP structure can use inductors on separate dies for the phase shifter on the tap chip (switches on chip) as shown in FIG. 13B.

The system 100 can include any number of transmit couplers 130 arranged in any manner and operating with any coupling factor.

As a person skilled in the art will recognize from the previous detailed description and from the figures and claims, modifications and changes can be made to the preferred embodiments of the invention without departing from the scope of this invention defined in the following claims.

We claim:

1. A system for integrated self-interference cancellation, comprising:
    a transmit coupler, communicatively coupled to a transmit signal of a full-duplex wireless transceiver, that samples the transmit signal to create a sampled transmit signal;
    an analog self-interference canceller, coupled to the transmit coupler, the analog self-interference canceller comprising:
        a controller;
        a signal divider, that splits the sampled transmit signal into a set of signal components, the set of signal components transmitted by way of a set of transmit paths;
        a set of phase shifters, coupled to the set of transmit paths, wherein a phase shifter of the set of phase shifters shifts a signal component of the set of signal components by a total phase shift value;

a set of scalers, coupled to the set of transmit paths, wherein a scaler of the set of scalers scales the signal component by a total scale factor;

a signal combiner, coupled to the set of transmit paths, that combines the set of signal components into a self-interference cancellation signal; and a receive coupler, communicatively coupled to a receive signal of the full duplex wireless transceiver, that combines the self-interference cancellation signal with the receive signal to remove at least a first portion of self-interference present in the receive signal.

2. The system of claim 1, wherein the controller generates a desired phase shift output of the phase shifter, encodes the desired phase shift output into a discrete phase shift value according to a hybrid thermometer code, and adjusts the total phase shift value of the phase shifter according to the discrete phase shift value.

3. The system of claim 2, wherein the total phase shift value comprises a set of phase shift values, each corresponding to a phase shift stage of the phase shifter, wherein the discrete phase shift value is approximated by activating a set of the phase shift stages to adjust the total phase shift value, and wherein the set is determined according to the hybrid thermometer code.

4. The system of claim 3, wherein the phase shift value of each of the set of phase shift stages is predetermined such that the discrete phase shift value is determined according to a piecewise linear approximation of a phase shift curve.

5. The system of claim 3, wherein each phase shifting stage comprises an LC network; wherein the phase shift stages are arranged in series, and each series pair of phase shift stages are coupled by shunt varactors.

6. The system of claim 1, wherein the controller increments the total phase shift value of the phase shifter according to a series of steps, wherein the steps are computed according to a hybrid thermometer code.

7. The system of claim 6, wherein the series of steps is computed according to a phase shift curve, wherein a first subset of the series of steps corresponding to coarse increments along the phase shift curve are computed according to a binary component of the hybrid thermometer code, and wherein a second subset of the series of steps corresponding to fine increments along the phase shift curve are computed according to a thermometer component of the hybrid thermometer code.

8. The system of claim 1, wherein the controller increments the total scale factor of the scaler according to a series of steps, the series of steps computed according to a hybrid thermometer code.

9. The system of claim 8, wherein the series of steps is computed according to a scale value curve, wherein a first subset of the series of steps corresponding to coarse increments along the scale value curve are computed according to a binary component of the hybrid thermometer code, and wherein a second subset of the series of steps corresponding to fine increments along the scale value curve are computed according to a thermometer component of the hybrid thermometer code.

10. The system of claim 9, wherein the scaler comprises a digital step attenuator.

11. The system of claim 9, wherein the controller generates a desired phase shift output of the phase shifter, encodes the desired phase shift output into a discrete phase shift value according to a second hybrid thermometer code, and adjusts the total phase shift value of the phase shifter according to the discrete phase shift value.

12. The system of claim 9, wherein the controller increments the total phase shift value of the phase shifter according to a second series of steps, the second series of steps computed according to a second hybrid thermometer code.

13. The system of claim 12, wherein the second series of steps is computed according to a phase shift curve, wherein a first subset of the second series of steps corresponding to coarse increments along the phase shift curve are computed according to a binary component of the second hybrid thermometer code, and wherein a second subset of the second series of steps corresponding to fine increments along the phase shift curve are computed according to a thermometer component of the second hybrid thermometer code.

14. The system of claim 1, wherein the analog self-interference canceller comprises a substrate, and wherein each scaler of the set of scalers and each phase shifter of the set of phase shifters comprises an input and an output.

15. The system of claim 14, wherein a first analog integrated circuit, coupled to the substrate, comprises the set of scalers and a set of circuit outputs, wherein a second integrated circuit, coupled to the substrate, comprises the set of phase shifters and a set of circuit inputs, and wherein the set of circuit outputs are coupled to the set of circuit inputs.

16. The system of claim 14, wherein a first analog integrated circuit, coupled to the substrate, comprises a first scaler of the set of scalers, a first phase shifter of the set of phase shifters, a circuit input, and a circuit output; wherein the circuit input is coupled to the scaler input, the scaler output is coupled to the phase shifter input, and the phase shifter output is coupled to the circuit output; and wherein the circuit output is coupled to the signal combiner.

17. The system of claim 16, wherein the first analog integrated circuit further comprises a digital passthrough, the digital passthrough comprising a buffer configured to pass digital control signals between the circuit input and the circuit output.

18. The system of claim 1, further comprising a set of transmit couplers, each of the set of transmit couplers coupled to the transmit signal and the analog self-interference canceller.

19. The system of claim 18, wherein each of the set of transmit couplers comprises a coupling factor; wherein the set of transmit couplers are coupled to the transmit signal and the analog self-interference canceller in a first configuration; and wherein the first configuration is determined according to a desired power profile of the set of transmit couplers, the desired power profile comprising the coupling factor of each of the set of transmit couplers in the first configuration.

20. The system of claim 19, wherein the coupling factor of each of the set of transmit couplers is selectable; and wherein the first configuration is selected by the controller by way of selecting the coupling factor of each of the set of transmit couplers.

* * * * *